(12) United States Patent
Patil et al.

(10) Patent No.: US 11,791,276 B2
(45) Date of Patent: Oct. 17, 2023

(54) PACKAGE COMPRISING PASSIVE COMPONENT BETWEEN SUBSTRATES FOR IMPROVED POWER DISTRIBUTION NETWORK (PDN) PERFORMANCE

(71) Applicant: QUALCOMM Incorporated, San Diego, CA (US)

(72) Inventors: Aniket Patil, San Diego, CA (US); Hong Bok We, San Diego, CA (US); Joan Rey Villarba Buot, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 107 days.

(21) Appl. No.: 17/225,949

(22) Filed: Apr. 8, 2021

(65) Prior Publication Data
US 2022/0328417 A1 Oct. 13, 2022

(51) Int. Cl.
| | |
|---|---|
| H01L 23/538 | (2006.01) |
| H01L 21/48 | (2006.01) |
| H01L 21/56 | (2006.01) |
| H01L 23/31 | (2006.01) |
| H01L 23/00 | (2006.01) |

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5385* (2013.01); *H01L 23/5386* (2013.01); *H01L 24/16* (2013.01); *H01L 2224/16227* (2013.01); *H01L 2924/19103* (2013.01); *H01L 2924/19105* (2013.01)

(58) Field of Classification Search
CPC ............ H01L 23/5389; H01L 21/4853; H01L 21/4857; H01L 21/565; H01L 23/3128; H01L 23/5383; H01L 23/5385; H01L 23/5386; H01L 24/16; H01L 2224/16227; H01L 2924/19103; H01L 2924/19105
See application file for complete search history.

(56) References Cited

U.S. PATENT DOCUMENTS

| | | | |
|---|---|---|---|
| 2012/0193789 A1* | 8/2012 | Hu | H01L 21/56 257/738 |
| 2013/0200528 A1* | 8/2013 | Lin | H01L 24/97 257/774 |
| 2015/0102484 A1 | 4/2015 | Chen et al. | |
| 2016/0118333 A1* | 4/2016 | Lin | H01L 22/20 257/773 |
| 2016/0190053 A1 | 6/2016 | Machida | |

(Continued)

OTHER PUBLICATIONS

International Search Report and Written Opinion—PCT/US2022/018955—ISA/EPO—dated Jun. 9, 2022.

*Primary Examiner* — Fernando L Toledo
*Assistant Examiner* — Neil R Prasad
(74) *Attorney, Agent, or Firm* — Loza & Loza, LLP

(57) ABSTRACT

A device comprising a first substrate comprising a first plurality of pillar interconnects; a second substrate comprising a second plurality of pillar interconnects, wherein the second plurality of pillar interconnects is coupled to the first plurality of pillar interconnects through a plurality of solder interconnects; a passive component located between the first substrate and the second substrate; and an integrated device coupled to the first substrate.

30 Claims, 18 Drawing Sheets

PROFILE VIEW

(56) References Cited

U.S. PATENT DOCUMENTS

| | | | | |
|---|---|---|---|---|
| 2016/0247754 A1* | 8/2016 | Fu | ............... | H01L 23/5389 |
| 2019/0088621 A1* | 3/2019 | Yang | ............... | H01L 25/0657 |
| 2019/0109114 A1* | 4/2019 | Patten | ............... | H01L 24/09 |
| 2020/0091128 A1* | 3/2020 | Elsherbini | ............... | H01L 24/17 |

* cited by examiner

PROFILE VIEW

PROFILE VIEW

PROFILE VIEW

PROFILE VIEW

PROFILE VIEW

PROFILE VIEW

US 11,791,276 B2

PACKAGE COMPRISING PASSIVE COMPONENT BETWEEN SUBSTRATES FOR IMPROVED POWER DISTRIBUTION NETWORK (PDN) PERFORMANCE

FIELD

Various features relate to packages and substrates.

BACKGROUND

FIG. 1 illustrates a package 100 that includes a substrate 102 and an integrated device 105. The substrate 102 includes at least one dielectric layer 120, a plurality of interconnects 122 and a plurality of solder interconnects 124. A plurality of solder interconnects 154 is coupled to a first surface of the substrate 102 and the integrated device 105. The package 100 is coupled to a board 106 through the plurality of solder interconnects 124. There is an ongoing need to improve the overall performance of the package 100.

SUMMARY

Various features relate to packages and substrates.

One example provides a device comprising a first substrate comprising a first plurality of pillar interconnects; a second substrate comprising a second plurality of pillar interconnects, wherein the second plurality of pillar interconnects is coupled to the first plurality of pillar interconnects through a plurality of solder interconnects; a passive component located between the first substrate and the second substrate; and an integrated device coupled to the first substrate.

Another example provides an apparatus comprising a first substrate comprising means for first pillar interconnection; a second substrate comprising means for second pillar interconnection, wherein the means for second pillar interconnection is coupled to the means for first pillar interconnection through a plurality of solder interconnects; a passive component located between the first substrate and the second substrate; and an integrated device coupled to the first substrate.

Another example provides a method for fabricating a device. The method provides a first substrate comprising a first plurality of pillar interconnects. The method couples a passive component to the first substrate. The method couples a second substrate comprising a second plurality of pillar interconnects, to the first substrate. The coupling of the second substrate to the first substrate comprises coupling the second plurality of pillar interconnects to the first plurality of pillar interconnects through a plurality of solder interconnects. The second substrate is coupled to the first substrate such that the passive component is located between the first substrate and the second substrate. The method couples an integrated device to the first substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a first substrate comprising a first plurality of pillar interconnects, a second substrate comprising a second plurality of pillar interconnects, a passive component located between the first substrate and the second substrate, and an integrated device coupled to the first substrate. The second plurality of pillar interconnects is coupled to the first plurality of pillar interconnects through a plurality of solder interconnects. The integrated device is configured to be electrically coupled to the passive component, as part of a power distribution network (PDN). The device may further include an encapsulation layer located between the first substrate and the second substrate, where the encapsulation layer at least partially encapsulates the passive component, the first plurality of pillar interconnects, the second plurality of pillar interconnects and the plurality of solder interconnects. The location of the passive component between the first substrate and the second substrate may help improve the PDN performance of the package.

Exemplary Packages that Include a Passive Component Between Substrates

Figure 1:
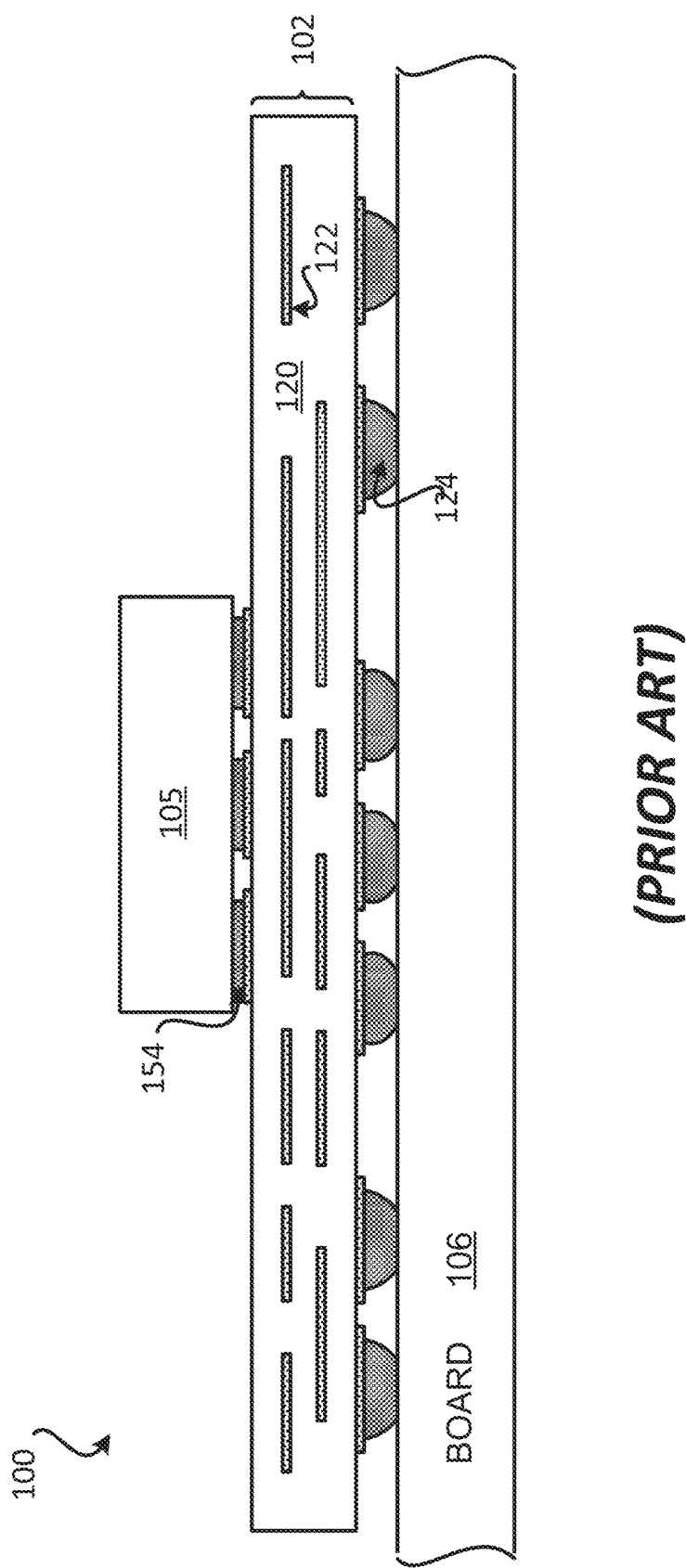
FIG. 1 illustrates a profile view of a package coupled to a board.
Figure 2:
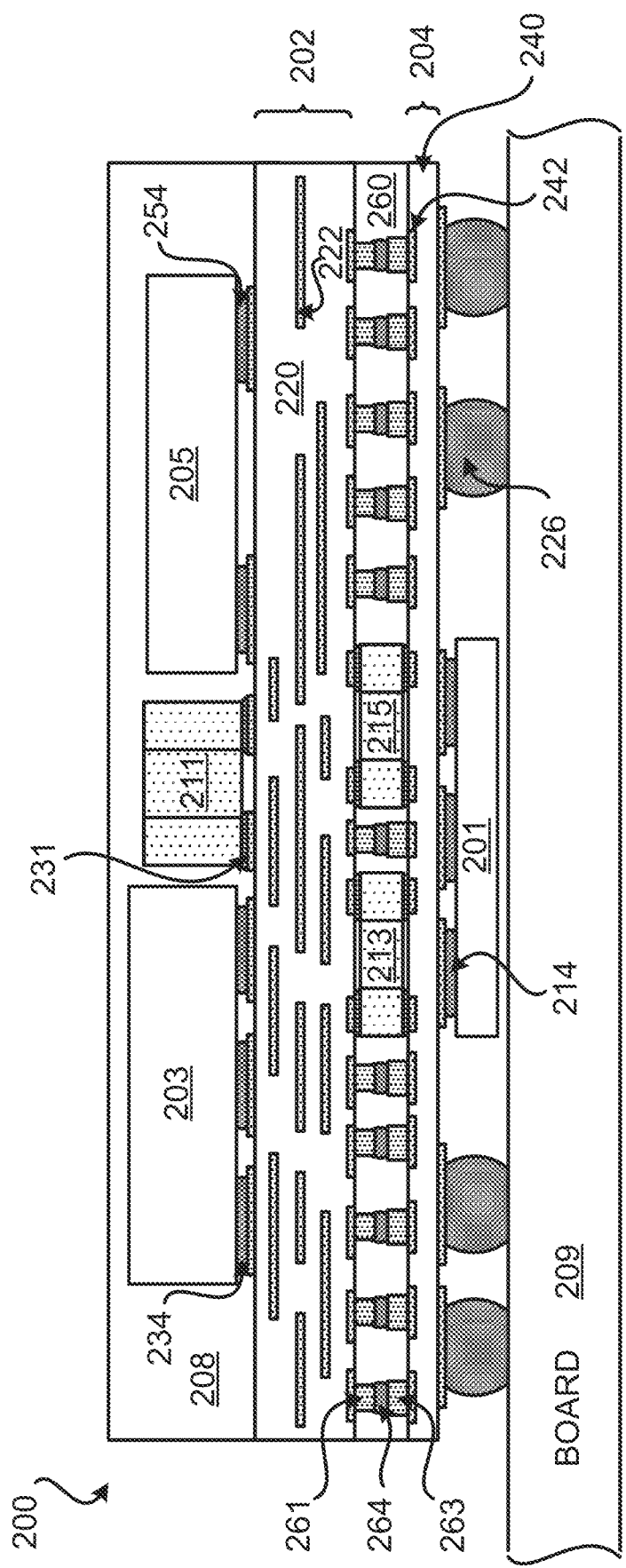
FIG. 2 illustrates a profile view of a package that includes two substrates and a passive component located between the two substrates.

FIG. 2 illustrates a profile view of a package 200 that includes a passive component between two substrates. The package 200 may be implemented as part of a device. The package 200 includes an integrated device 201, a substrate 202, a substrate 204, an integrated device 203, an integrated device 205, an encapsulation layer 208, a passive component 211, a passive component 213, a passive component 215, a plurality of solder interconnects 226, and an encapsulation layer 260. The package 200 is coupled to a board 209 (e.g., printed circuit board) through the plurality of solder interconnects 226. As will be further described below, at least one of passive component (e.g., 213, 215) is located between the substrate 202 and the substrate 204, which may help improve the power distribution network (PDN) performance of the package 200.

The substrate 202 may be a first substrate. The substrate 202 includes at least one dielectric layer 220 and a plurality of interconnects 222. The substrate 202 may also include a plurality of pillar interconnects 261. The plurality of pillar interconnects 261 may include a means for pillar interconnection (e.g., means for first pillar interconnection). Different substrates may have different numbers of metal layers. In some implementations, the substrate 202 may include 7 or less metal layers. Different implementations may use different substrates for the substrate 202. The substrate 202 may include an embedded trace substrate (ETS), a laminate substrate, and/or a coreless substrate. The substrate 202 may be fabricated using different processes, including an ETS process, a semi-additive process (SAP), and a modified semi-additive process (mSAP).

The substrate 204 may be a second substrate. The substrate 204 includes at least one dielectric layer 240 and a plurality of interconnects 242. The substrate 204 may also include a plurality of pillar interconnects 263. The plurality of pillar interconnects 263 may include a means for pillar interconnection (e.g., means for second pillar interconnection). Different substrates may have different numbers of metal layers. In some implementations, the substrate 204 may include 4 or less metal layers. Different implementations may use different substrates for the substrate 204. The substrate 204 may include an embedded trace substrate (ETS), a laminate substrate, and/or a coreless substrate. The substrate 204 may be fabricated using different processes, including an ETS process, a semi-additive process (SAP), and a modified semi-additive process (mSAP).

Using two substrates with a combined 11 or less metal layers, may help improve the overall yield of the package during the fabrication process of the substrates and/or the package. Also, using two substrates instead of one substrate allows at least one of the passive components (e.g., 213, 215) to be located closer to an integrated device. For example, if the substrate 202 and the substrate 204 were replaced with a single substrate having a similar number of metal layers as the combined number of metal layers of the substrate 202 and the substrate 204, the passive components 213 and 215 may have to be located on a similar surface as the passive component 211, which would put the passive components 213 and 215 farther away from the integrated device 201. Positioning the passive components 213 and/or 215 farther away from the integrated device 201, may lead to decrease PDN performance of the package 200.

The integrated device 203, the integrated device 205 and the passive component 211 are coupled to a first surface (e.g., top surface) of the substrate 202. For example, the integrated device 203 is coupled to the substrate 202 through a plurality of solder interconnects 234. Similarly, the integrated device 205 is coupled to the substrate 202 through the plurality of solder interconnects 254. The passive component 211 is coupled to the substrate 202 through the plurality of solder interconnects 231. The encapsulation layer 208 is formed and located over the substrate 202 (e.g., first surface of the substrate 202), the integrated device 203, the integrated device 205, and/or the passive component 211. The encapsulation layer 208 may include a mold, a resin and/or an epoxy. The encapsulation layer 208 may be a means for encapsulation.

The passive component 213, the passive component 215 and the encapsulation layer 260 are located between the substrate 202 and the substrate 204. The substrate 202 and the substrate 204 are each coupled to the encapsulation layer 260. The encapsulation layer 260 may include a mold, an underfill, an adhesive, a non-conductive paste (NCP) and/or a non-conductive film (NCF). The encapsulation layer 260 may be a means for encapsulation. The substrate 202 is coupled to the substrate 204 through the plurality of pillar interconnects 261, the plurality of solder interconnects 264 and the plurality of pillar interconnects 263. The encapsulation layer 260 may encapsulate the passive component 213, the passive component 215, the plurality of pillar interconnects 261, the plurality of solder interconnects 264 and the plurality of pillar interconnects 263.

The integrated device 201 is coupled to a second surface (e.g., bottom surface) of the substrate 204 through a plurality of solder interconnects 214. The integrated device 201 may be located laterally to the plurality of solder interconnects 226.

Figure 10:
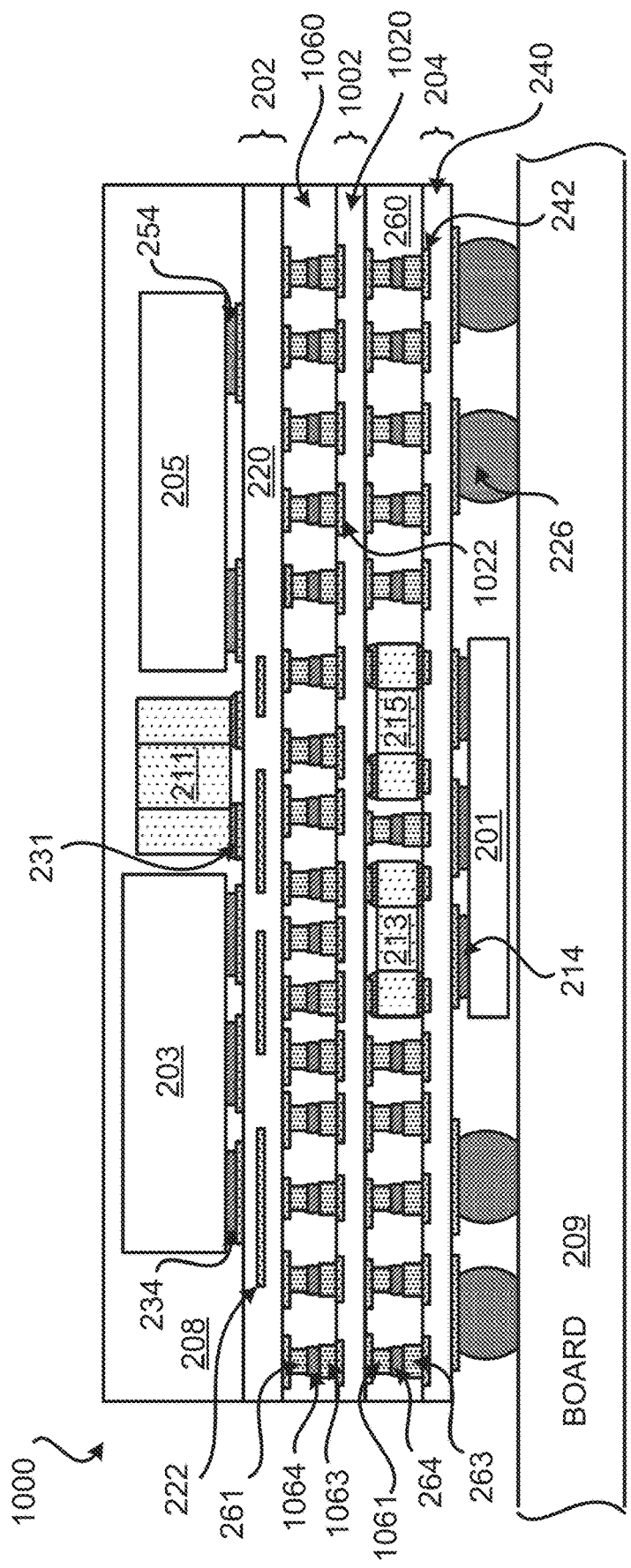
FIG. 10 illustrates a profile view of a package that includes three substrates and a passive component located between two substrates.

The package 200 includes a power distribution network (PDN). In some implementations, the integrated device 201, the passive component 213, the passive component 215, the passive component 211, the integrated device 203 and/or the integrated device 205 may be part and/or configured to be electrically coupled to the PDN of the package 200. In one example, the integrated device 201 and the passive component 213 are configured to be electrically coupled to the PDN of the package 200. In another example, the integrated device 203 and the passive component 213 are configured to be electrically coupled to the PDN of the package 200. In the example where the integrated device 201 and the passive component 213 are part of the PDN of the package, the fact that the passive component 213 is close to the integrated device 201 helps improve the PDN performance of the package 200. If the passive component 213 were located on the same plane as the passive component 211, the PDN performance of the package 200 wouldn't be as good due to the increase distance and/or separation between the passive component 213 and the integrated device 201. In some implementations, the vertical distance between the passive component 213 and the integrated device 201 may be 4 metal layers or less. A person of ordinary skill in the art may use any combinations of the integrated device(s) and passive component(s) as part of a PDN for a package. It is noted that the passive components 213 and/or 215 may be located in different locations of the package 200. For example, the passive components 213 and/or 215 may be coupled to a top surface of the substrate 202. It is also noted that in some implementations, there may not be a passive component between the substrate 202 and the substrate 204. It is noted that the package 200 may include two or more substrates. For example, the package 200 may include the substrate 202, the substrate 204 and a third substrate. The third substrate may be similar to the substrate 202 and/or the substrate 204. FIG. 10, which is described further below, illustrates an example of a package that include more than two substrates.

Figure 3:
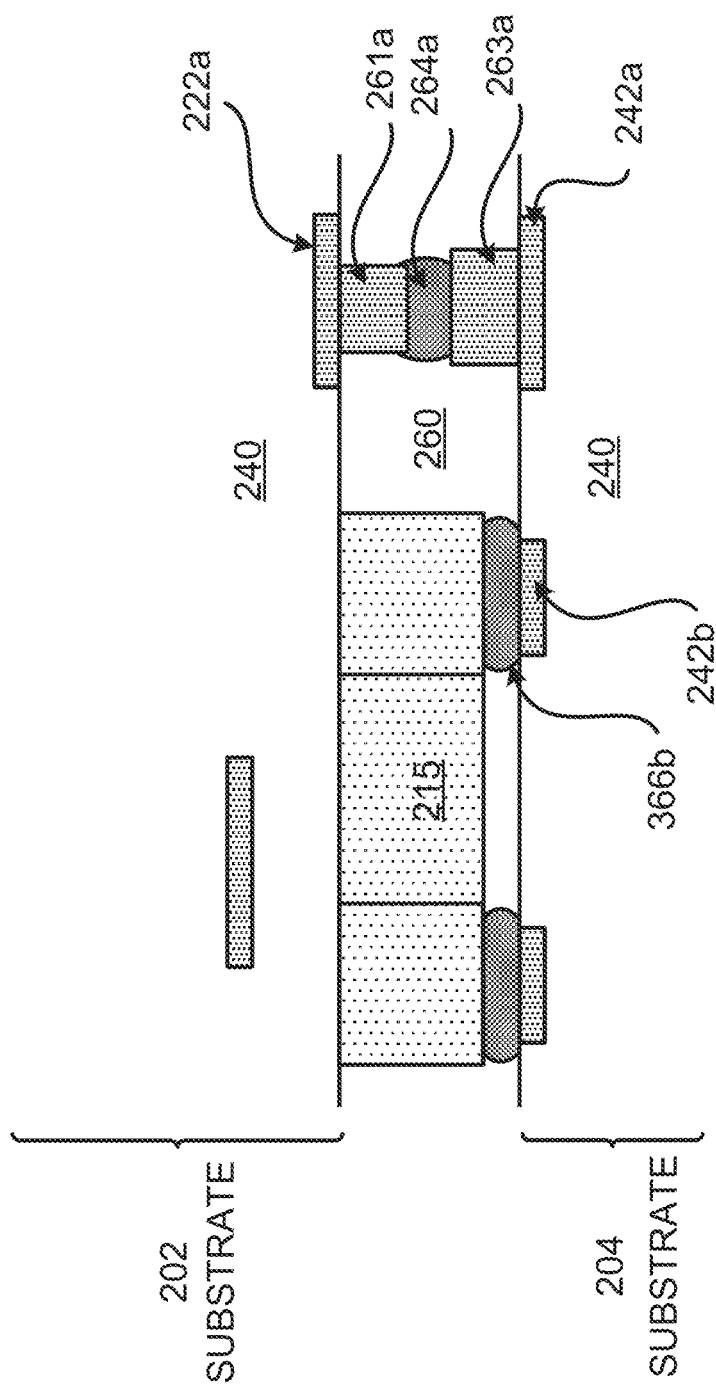
FIG. 3 illustrates a close-up profile view of a package that includes two substrates and a passive component located between the two substrates.
Figure 4:
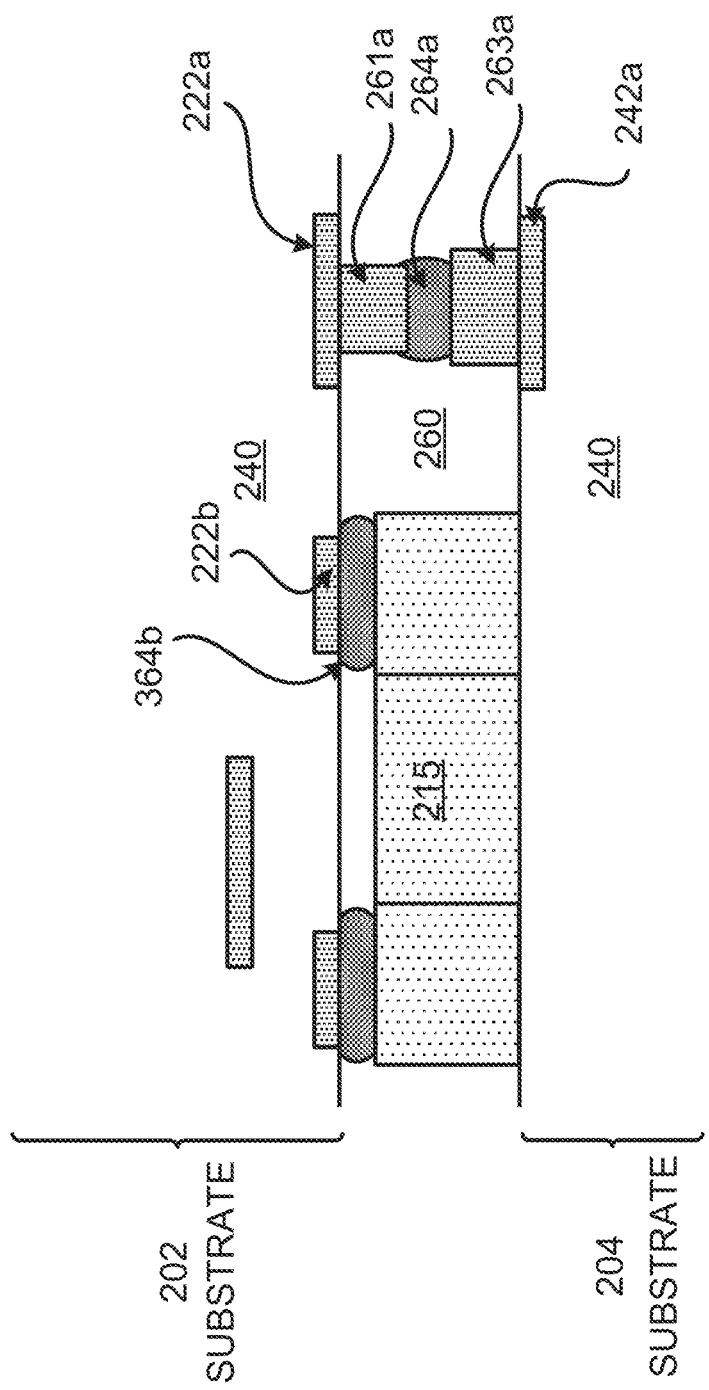
FIG. 4 illustrates a close-up profile view of a package that includes two substrates and a passive component located between the two substrates.
Figure 5:
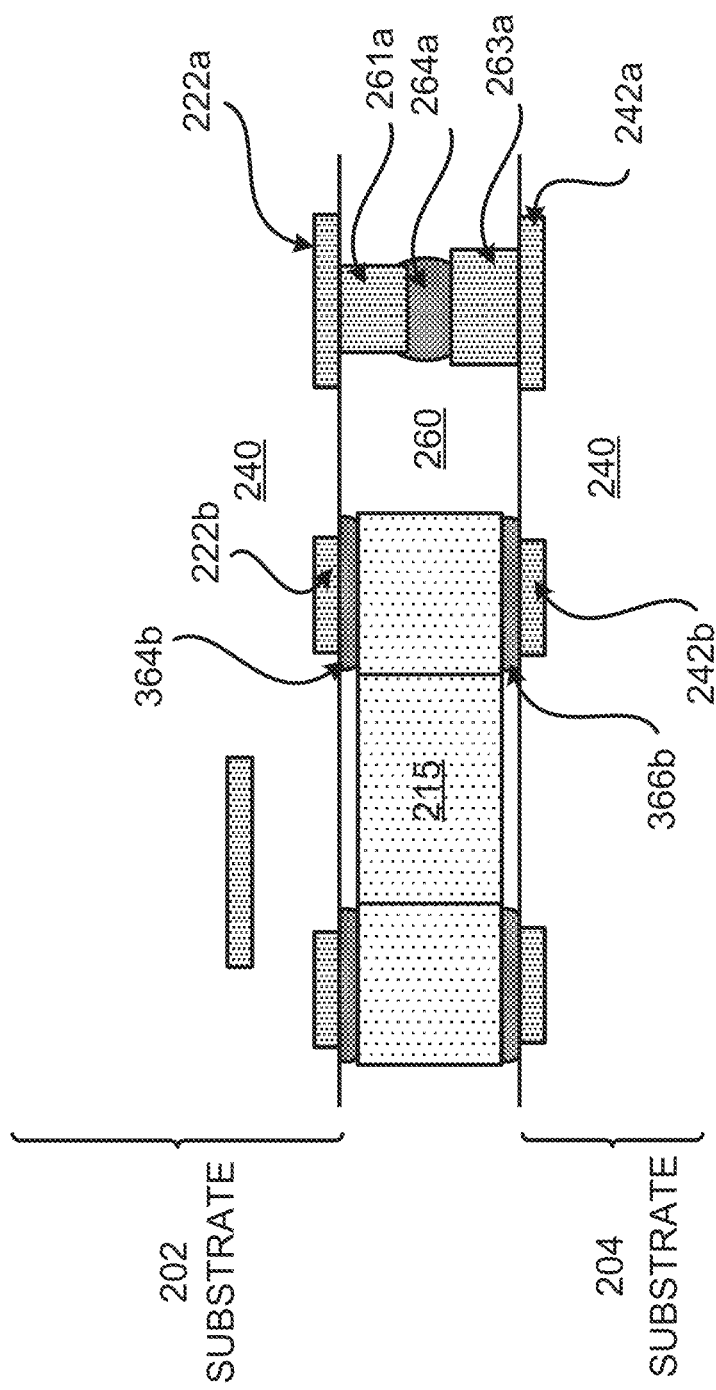
FIG. 5 illustrates a close-up profile view of a package that includes two substrates and a passive component located between the two substrates.

FIGS. 3-5 illustrate various examples of how a passive component may be located and coupled between two substrates. The configurations shown in FIGS. 3-5 may be applicable to the package 200 of FIG. 2.

FIG. 3 illustrates an example of the passive component 215 coupled to the substrate 202 and the substrate 204. A top portion of the passive component 215 is coupled (e.g., mechanically coupled) to the bottom surface of the substrate 202. The encapsulation layer 260 may help couple the passive component 215 to the substrate 202. In some implementations, an adhesive may be used to couple to the passive component 215 to the substrate 202. A bottom portion of the passive component 215 is coupled (e.g., mechanically coupled, electrically coupled) to a top surface of the substrate 204 through a solder interconnect 366b. The passive component 215 may be coupled to the interconnect 242b through the solder interconnect 366b. In some implementations, a current traveling through a PDN of the package may travel through the passive component 215, the solder interconnect 366b, the interconnect 242b, the interconnect 242a, the pillar interconnect 263a, the solder interconnect 264a, the pillar interconnect 261a and the interconnect 222a. It is noted that a current traveling through the PDN of the package may travel through other interconnects and/or different directions.

FIG. 4 illustrates another example of the passive component 215 coupled to the substrate 202 and the substrate 204. A bottom portion of the passive component 215 is coupled (e.g., mechanically coupled) to the top surface of the substrate 204. The encapsulation layer 260 may help couple the passive component 215 to the substrate 204. In some implementations, an adhesive may be used to couple to the passive component 215 to the substrate 204. A top portion of the passive component 215 is coupled (e.g., mechanically coupled, electrically coupled) to a bottom surface of the substrate 202 through a solder interconnect 364b. The passive component 215 may be coupled to the interconnect 222b through the solder interconnect 364b. In some implementations, a current traveling through a PDN of the package may travel through the interconnect 242a, the pillar interconnect 263a, the solder interconnect 264a, the pillar interconnect 261a, the interconnect 222a, the interconnect 222b, the solder interconnect 364b, and the passive component 215. It is noted that a current traveling through the PDN of the package may travel through other interconnects and/or different directions.

FIG. 5 illustrates another example of the passive component 215 coupled to the substrate 202 and the substrate 204. A bottom portion of the passive component 215 is coupled (e.g., mechanically coupled, electrically coupled) to a bottom surface of the substrate 204 through a solder interconnect 366b. The passive component 215 may be coupled to the interconnect 242b through the solder interconnect 366b. A top portion of the passive component 215 is coupled (e.g., mechanically coupled, electrically coupled) to a bottom surface of the substrate 202 through a solder interconnect 364b. The passive component 215 may be coupled to the interconnect 222b through the solder interconnect 364b.

It is noted that the passive component 213 may be coupled (e.g., electrically coupled, mechanically coupled) to the substrate 202 and the substrate 204 in a similar manner and/or configuration as described in FIGS. 3-5. Different implementations may have different spacings (e.g., minimum spacing) between the substrate 202 and the substrate 204. In some implementations, a minimum spacing between a bottom surface of the substrate 202 and a top surface of the substrate 204 may be about 120 micrometers. In some implementations, the encapsulation layer 260 may have a minimum thickness of 120 micrometers. In some implementations, the passive components located between the substrate 202 and the substrate 204 may have a thickness of 100 micrometers or less. In some implementations, the plurality of pillar interconnects 261 may have a thickness of 60 micrometers or less (e.g., about 50 micrometers). In some implementations, the plurality of pillar interconnects 263 may have a thickness of 60 micrometers or less (e.g., about 50 micrometers).

An integrated device (e.g., 201, 203, 205) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a processor, a memory, a power management integrated device and/or combinations thereof. An integrated device (e.g., 201, 203, 205) may include at least one electronic circuit (e.g., first electronic circuit, second electronic circuit, etc. . . . ). A passive component (e.g., 211, 213, 215) may include a surface mounted device (SMD). A passive component may include a discrete passive component. A passive component may include an integrated passive device (IPD). A passive component may include a capacitor or a resistor.

The configurations and designs of the package 200 provide packages with improved PDN performance due to the fact that at least one of the passive components may be physically close to at least some of the integrated devices. Moreover, using substrates with lower number of metal layers may help improve the yield of the substrates, which helps reduce the cost of the substrate. In some implementations, different combinations of substrates may be used between a first substrate and a second substrate. For example, a first substrate may have a lower density interconnects, while a second substrate may have higher density interconnects.

Having described various packages, a sequence for fabricating a package will now be described below.

Exemplary Sequence for Fabricating a Package Comprising a Passive Component Between Substrates FIGS. 6A-6D illustrate an exemplary sequence for providing or fabricating a package that includes a passive component between substrate. In some implementations, the sequence of FIGS. 6A-6D may be used to provide or fabricate the package 200 of FIG. 2, or any of the packages described in the disclosure.

It should be noted that the sequence of FIGS. 6A-6D may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure. Different implementations may fabricate a package differently.

Figure 6A:
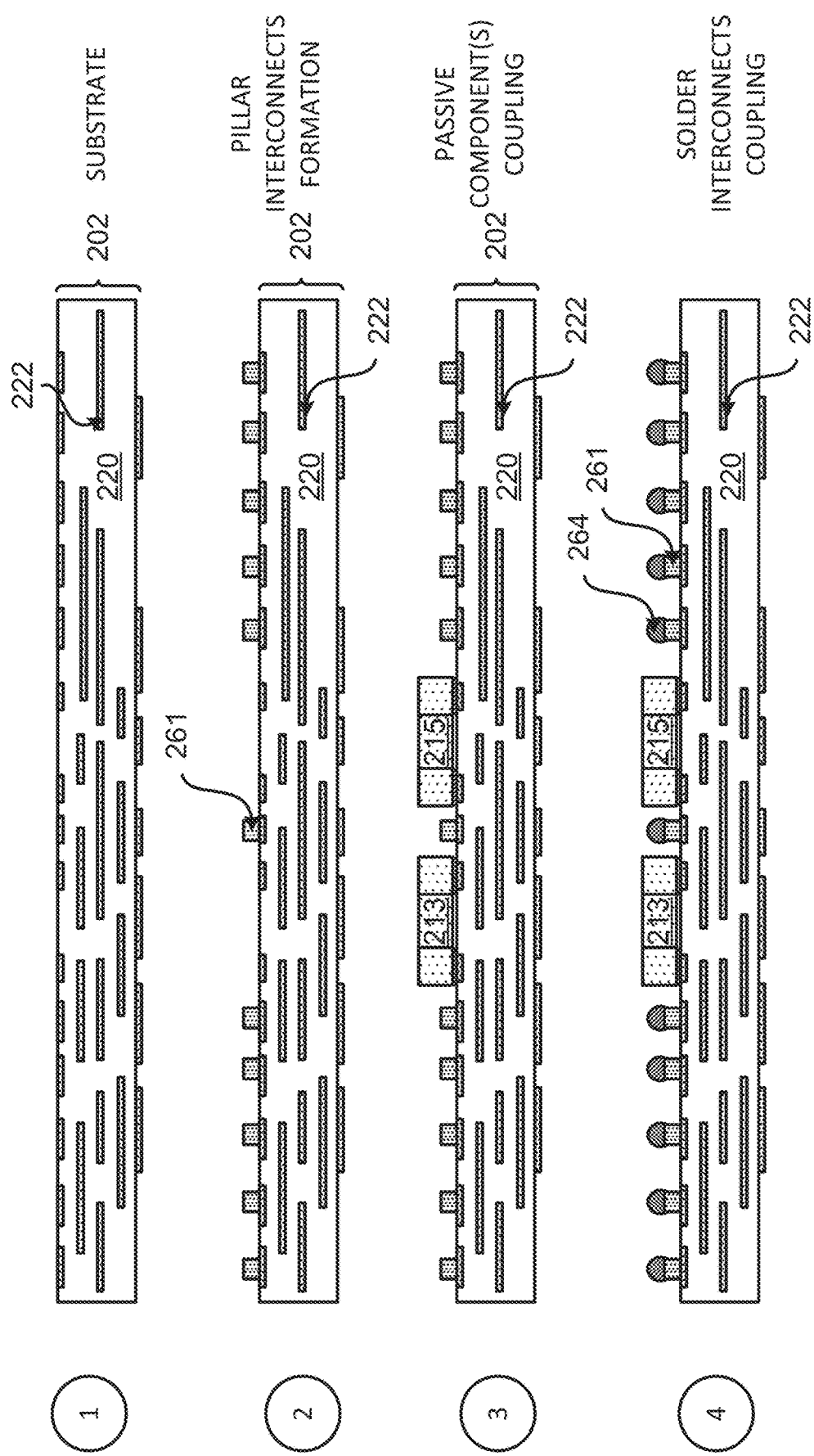
FIGS. 6A-6D illustrate an exemplary sequence for fabricating a package that includes two substrates and a passive component located between the two substrates.

Stage 1, as shown in FIG. 6A, illustrates a state after a substrate 202 is provided. The substrate 202 includes at least one dielectric layer 220 and a plurality of interconnects 222. The substrate 202 may include different numbers of metal layers. The substrate 202 may include a laminated substrate and/or a coreless substrate (e.g., ETS). The substrate 202 may be a first substrate.

Stage 2 illustrates a state after the plurality of pillar interconnects 261 is formed over the substrate 202. A plating process may be used to form the plurality of interconnects 261. The plurality of pillar interconnects 261 may be considered part of the substrate 202.

Stage 3 illustrates a state after the passive components 213 and the passive component 215 are coupled to the substrate 202. A pick and place process may be used to place the passive components over the substrate 202. In some implementations, an adhesive may be used to couple the passive components to the substrate 202. In some implementations, a solder reflow process may be used to couple the passive components to the substrate 202.

Stage 4 illustrates a state after the plurality of solder interconnects 264 is formed over the plurality of pillar interconnects 261. A solder reflow process may be used to form the plurality of solder interconnects 264 over the plurality of pillar interconnects 261.

Figure 6B:
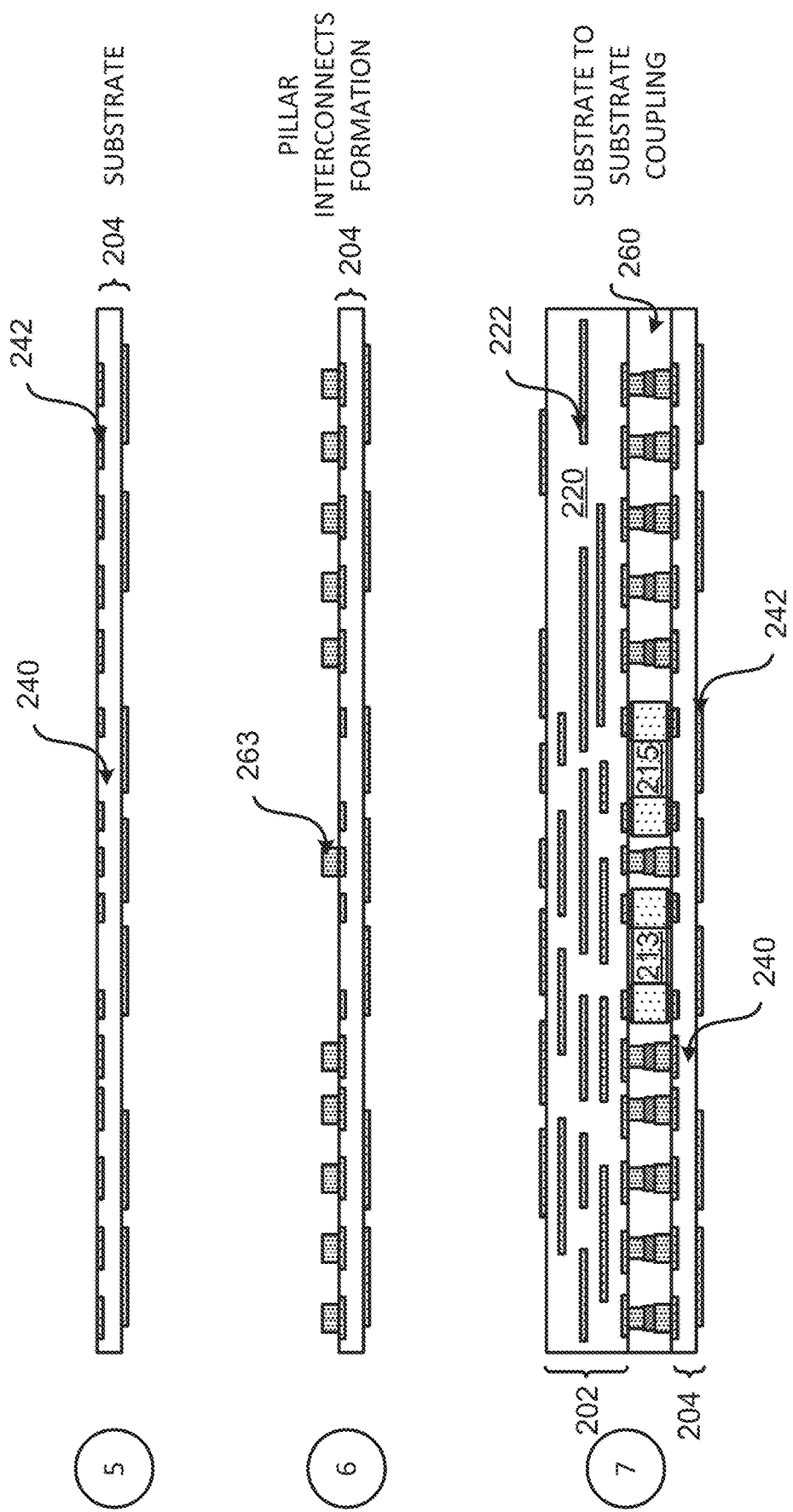

Stage 5, as shown in FIG. 6B, illustrates a state after a substrate 204 is provided. The substrate 204 includes at least one dielectric layer 40 and a plurality of interconnects 242. The substrate 204 may include different numbers of metal layers. The substrate 204 may include a laminated substrate and/or a coreless substrate (e.g., ETS). The substrate 204 may be a second substrate.

Stage 6 illustrates a state after the plurality of pillar interconnects 263 is formed over the substrate 204. A plating process may be used to form the plurality of interconnects 263. The plurality of pillar interconnects 263 may be considered part of the substrate 204.

Stage 7 illustrates a state after the substrate 202 is coupled to the substrate 204 such that the passive component 213 and the passive component 215 are located between the substrate 202 and the substrate 204. The substrate 202 is coupled to the substrate 204 through the plurality of pillar interconnects 261, the plurality of solder interconnects 264 and the plurality of pillar interconnects 263. The encapsulation layer 260 may be formed between the substrate 202 and the substrate 204 during the process of coupling the substrate 202 and the substrate 204, or after the coupling of the substrate 202 and the substrate 202. A mass reflow process, a flip clip attach process, and/or a thermal compression flip chip (TCFC) process may be used to couple the substrate 202 and the substrate 204. The encapsulation layer 260 may include a mold, an underfill, an adhesive, a non-conductive paste (NCP) and/or a non-conductive film (NCF). In some implementations, a compression and transfer molding process, a sheet molding process, or a liquid molding process may be used to form the encapsulation layer 260.

Figure 6C:
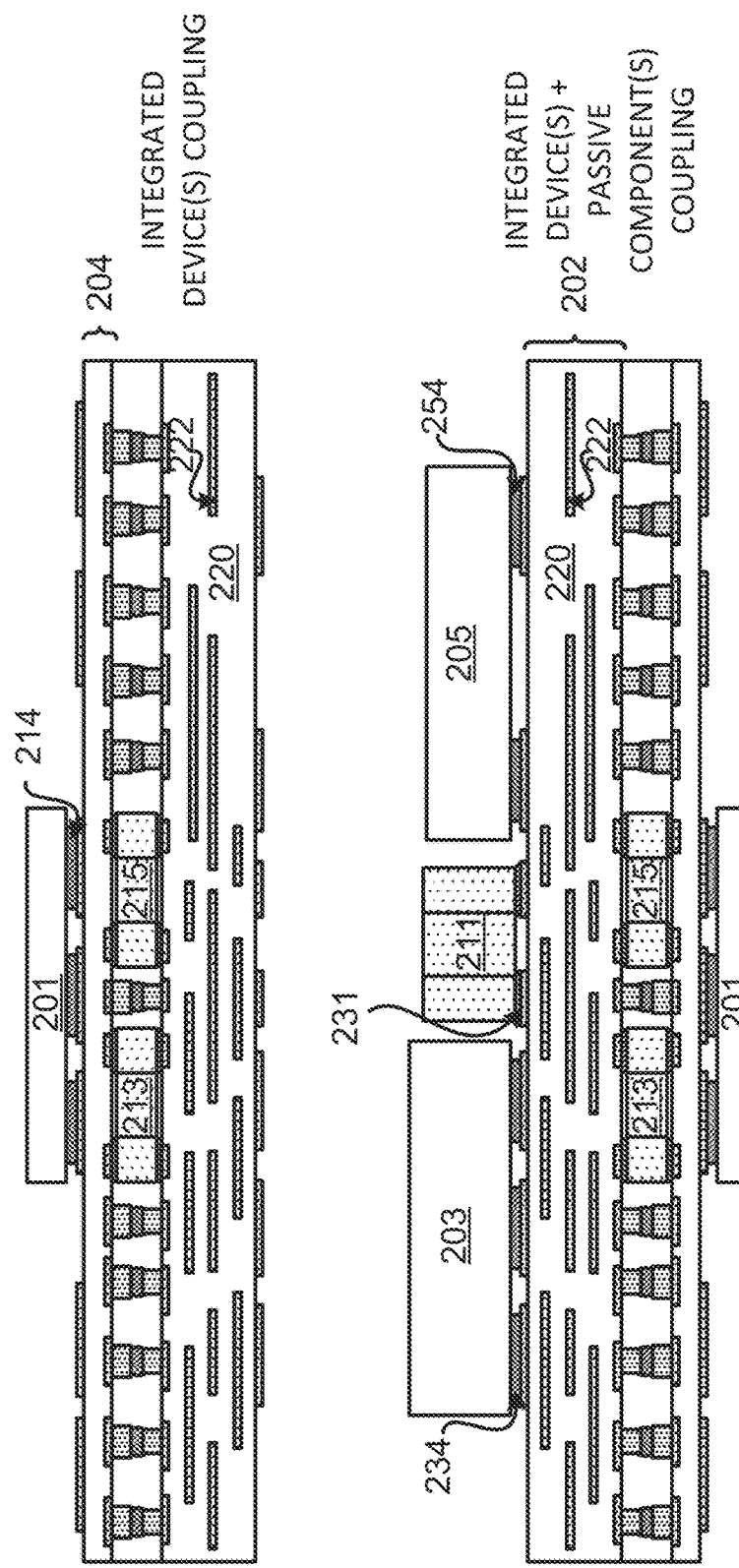

Stage 8, as shown in FIG. 6C, illustrates a state after the integrated device 201 is coupled to a second surface (e.g., bottom surface) of the substrate 202. The integrated device 201 may be coupled to the substrate 204 through the plurality of solder interconnects 214. A solder reflow process may be used to couple the integrated device 201 to the substrate 204.

Stage 9 illustrates a state after the integrated device 203, the integrated device 205 and the passive component 211 are coupled to a first surface (e.g., top surface) of the substrate 202. The integrated device 203 may be coupled to the substrate 202 through a plurality of solder interconnects 234. The integrated device 205 may be coupled to the substrate 202 through a plurality of solder interconnects 254. The passive component 211 may be coupled to the substrate 202 through the plurality of solder interconnects 231. One or more solder reflow processes may be used to couple to the plurality of solder interconnects (e.g., 231, 234, 254) to the substrate 202.

Figure 6D:
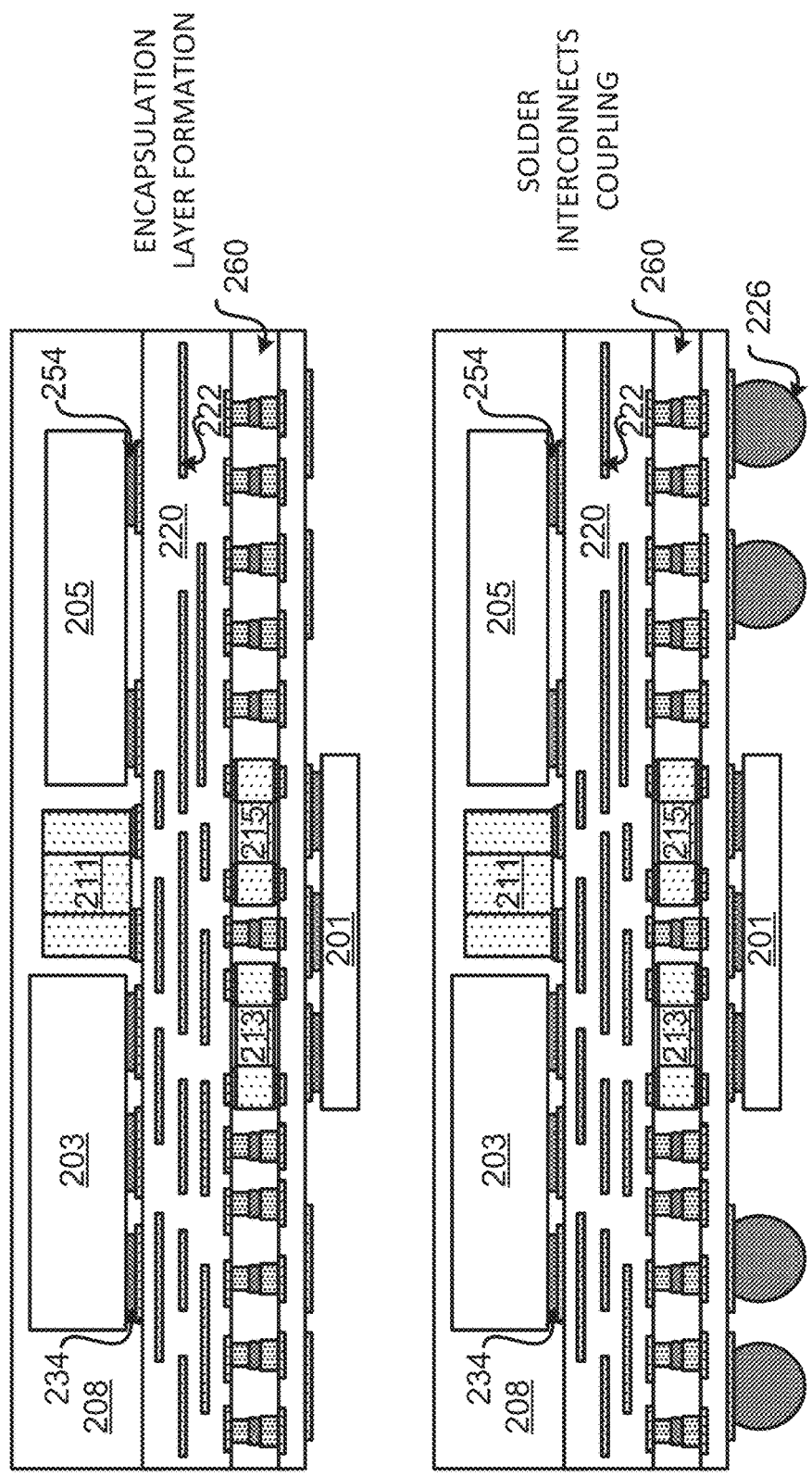

Stage 10, as shown in FIG. 6D, illustrates a state after an encapsulation layer 208 is formed over the substrate 202, the integrated device 203, the integrated device 205 and/or the passive component 211. The encapsulation layer 208 may encapsulate the integrated device 203, the integrated device 205 and/or the passive component 211. A compression and transfer molding process, a sheet molding process, or a liquid molding process may be used to form the encapsulation layer 208.

Stage 11 illustrates a state the plurality of solder interconnects 226 is coupled to the bottom surface of the substrate 204. A solder reflow process may be used to couple the plurality of solder interconnects 226 to the substrate 204. The plurality of solder interconnects 226 may be coupled to pad interconnects from the plurality of interconnects 242. The plurality of solder interconnects 226 may be located laterally to the integrated device 201. Stage 11 may illustrate the package 200 that includes at least one passive component located between two substrates.

Figure 7:
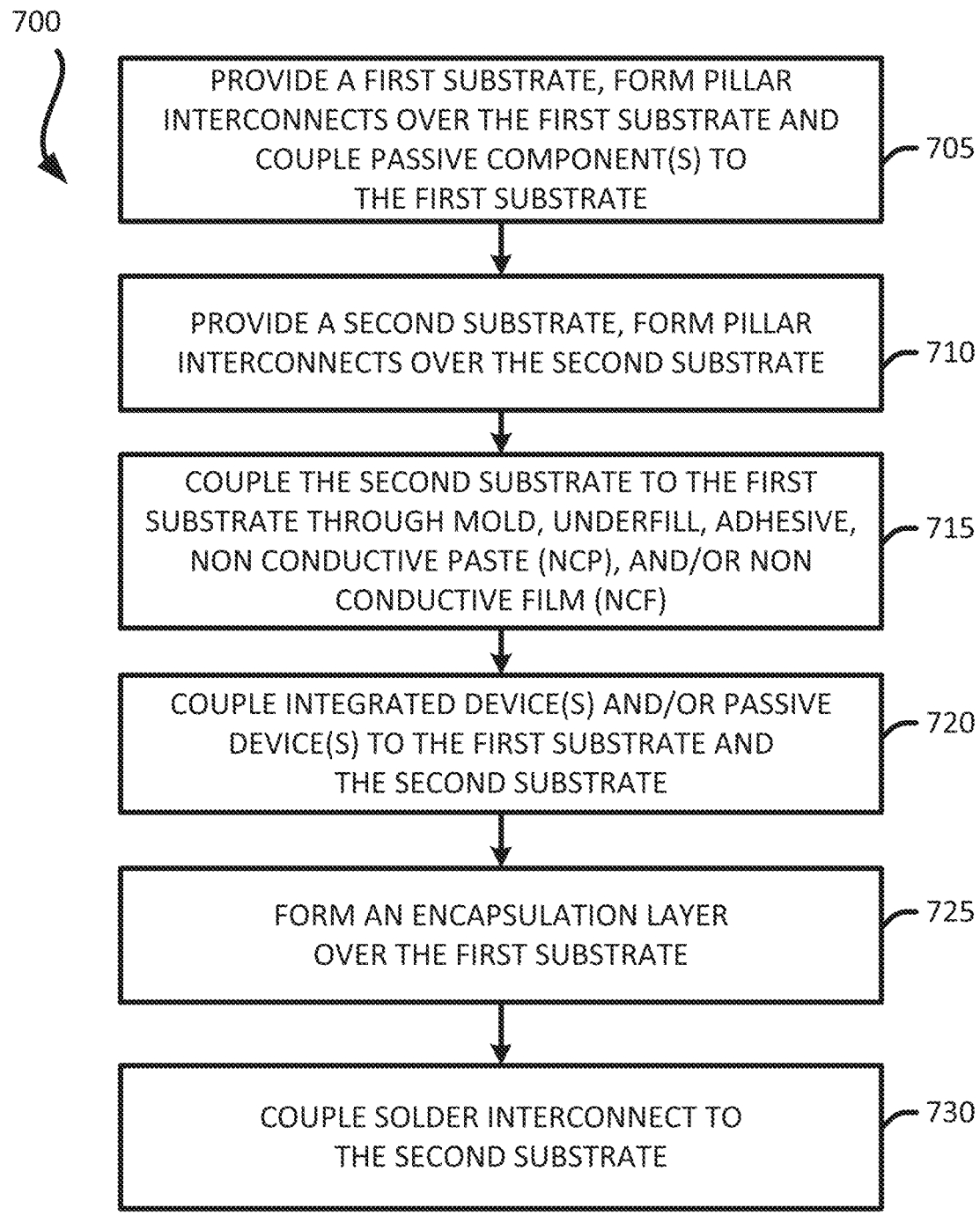
FIG. 7 illustrates an exemplary flow diagram of a method for fabricating a package that includes two substrates and a passive component located between the two substrates.

Exemplary Flow Diagram of a Method for Fabricating a Package Comprising a Passive Component Between Substrates In some implementations, fabricating a package includes several processes. FIG. 7 illustrates an exemplary flow diagram of a method 700 for providing or fabricating a package that includes at least one passive component located between two substrates. In some implementations, the method 700 of FIG. 7 may be used to provide or fabricate the package 200 of FIG. 2. However, the method 700 of FIG. 7 may be used fabricate any package in the disclosure.

It should be noted that the method of FIG. 7 may combine one or more processes in order to simplify and/or clarify the method for providing or fabricating a package. In some implementations, the order of the processes may be changed or modified.

The method provides (at 705) a first substrate (e.g., substrate 202), forms pillar interconnects over the first substrate and couples at least one passive component (e.g., 213, 215) to the first substrate. The substrate 202 includes at least one dielectric layer 220 and a plurality of interconnects 222. The substrate 202 may include different numbers of metal layers. The substrate 202 may include a laminated substrate and/or a coreless substrate (e.g., ETS). Stage 1 of FIG. 6A, illustrates and describes an example of providing a substrate. Forming a plurality of pillar interconnects over a substrate may include using a plating process. Stage 2 of FIG. 6A, illustrates and describes an example of forming pillar interconnects. The passive component(s) may be coupled to a surface of a substrate. Stage 3 of FIG. 6A, illustrates and describes an example of coupling at least one passive component to a substrate. In some implementations, a plurality of solder interconnects (e.g., 264) may be formed over the plurality of pillar interconnects. Stage 4 of FIG. 6A illustrates and describes an example of forming solder interconnects.

The method provides (at 710) a second substrate (e.g., substrate 204) and forms pillar interconnects over the second substrate. The substrate 204 includes at least one dielectric layer 240 and a plurality of interconnects 242. The substrate 204 may include different numbers of metal layers. The substrate 204 may include a laminated substrate and/or a coreless substrate (e.g., ETS). Stage 5 of FIG. 6B, illustrates and describes an example of providing a substrate. Forming a plurality of pillar interconnects over a substrate may include using a plating process. Stage 6 of FIG. 6B, illustrates and describes an example of forming pillar interconnects.

The method couples (at 715) the second substrate (e.g., substrate 204) to the first substrate (e.g., 202). The second substrate may be coupled to the first substrate through an encapsulation layer (e.g., 260). The encapsulation layer 260 may be formed between the first substrate and the second substrate during the process of coupling the first substrate and the second substrate, or after the coupling of the first substrate and the second substrate. The encapsulation layer 260 may include a mold, an underfill, an adhesive, a non-conductive paste (NCP) and/or a non-conductive film (NCF). In some implementations, a compression and transfer molding process, a sheet molding process, or a liquid molding process may be used to form the encapsulation layer 260. The second substrate is coupled to the first substrate such that at least one passive component (e.g., 213, 215) is located between the first substrate and the second substrate. The first substrate is coupled to the second substrate through a plurality of pillar interconnects (e.g., 261), a plurality of solder interconnects (e.g., 264) and a plurality of pillar interconnects (e.g., 263). Stage 7 of FIG. 6B illustrates and describes an example of coupling a second substrate to a first substrate.

The method couples (at 720) integrated device(s) and/or passive component(s) to the first substrate and the second substrate. For example, the integrated device 201 may be coupled to the second substrate (e.g., substrate 204), and the integrated device 203 and passive component 211 may be coupled to a first substrate (e.g., substrate 202). Coupling the integrated device(s) and/or passive component(s) may include using a solder reflow process. Stages 8 and 9 of FIG. 6C illustrate and describes examples of coupling integrated devices and passive components to substrates.

The method forms (at 725) an encapsulation layer (e.g., 208) over the first substrate. The encapsulation layer 208 may be formed over the substrate 202, the integrated device 203, the integrated device 205 and/or the passive component 211. The encapsulation layer 208 may encapsulate the integrated device 203, the integrated device 205 and/or the passive component 211. A compression and transfer molding process, a sheet molding process, or a liquid molding process may be used to form the encapsulation layer 208. Stage 10 of FIG. 6D illustrates and describes an example of forming an encapsulation layer.

The method couples (at 730) solder interconnects (e.g., 226) to the second substrate (e.g., substrate 204). The plurality of solder interconnects 226 may be coupled to the bottom surface of the substrate 204. A solder reflow process may be used to couple the plurality of solder interconnects 226 to the substrate 204. The plurality of solder interconnects 226 may be coupled to pad interconnects from the plurality of interconnects 242. Stage 11 of FIG. 6D illustrate and describes an example of coupling solder interconnects to a substrate.

Exemplary Sequence for Fabricating a Substrate

Figure 8A:
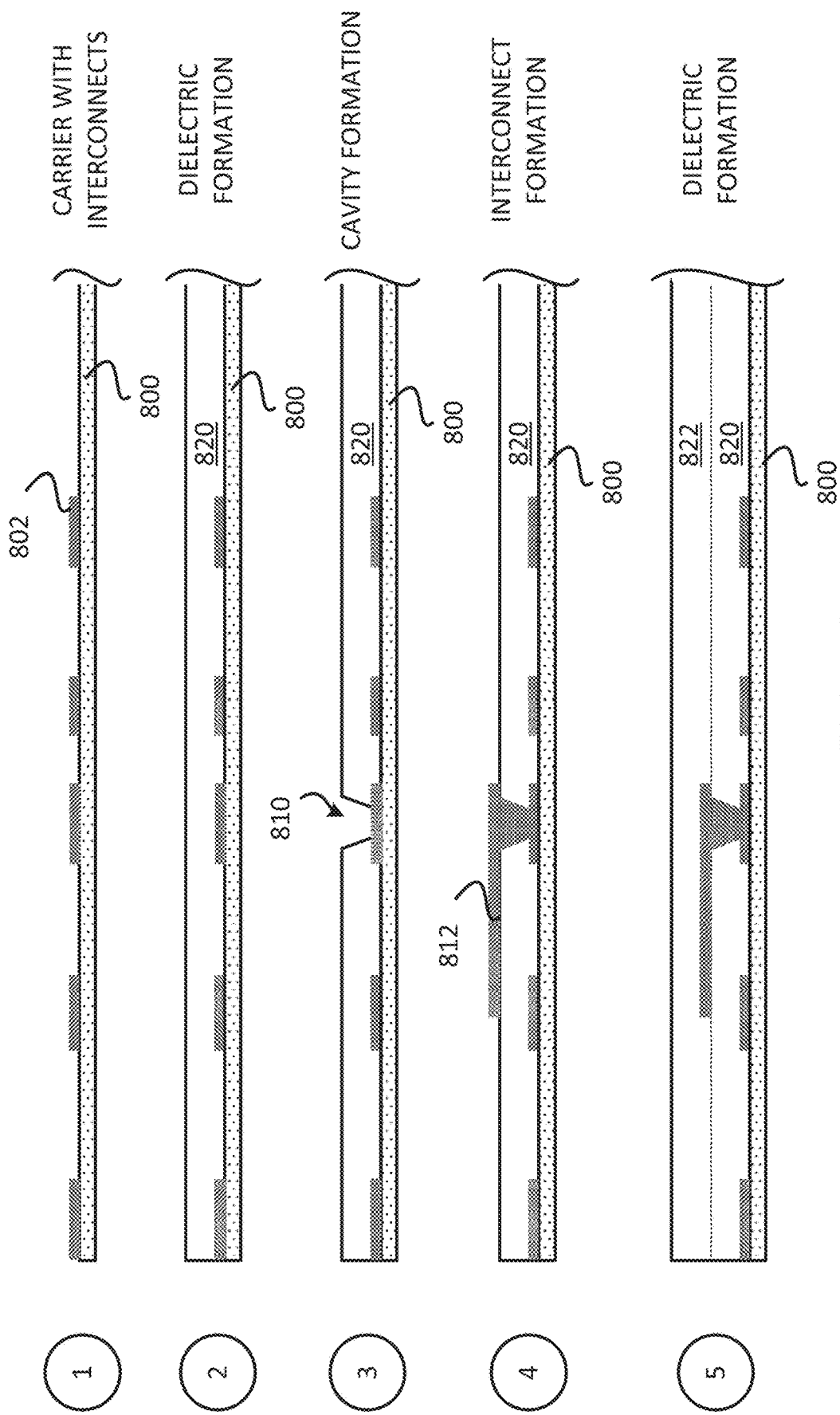
FIGS. 8A-8C illustrate an exemplary sequence for fabricating a substrate.
Figure 8B:
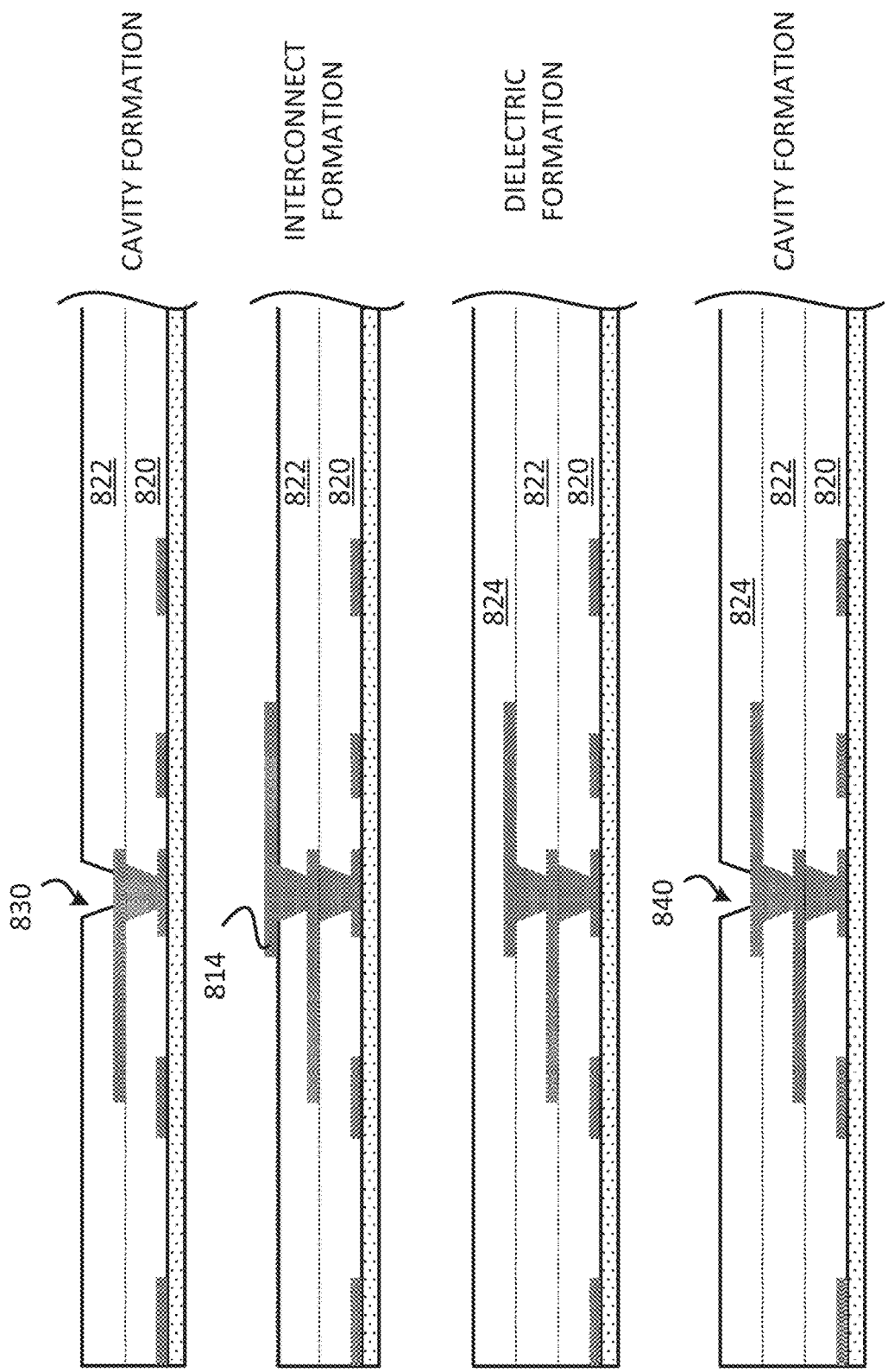
Figure 8C:
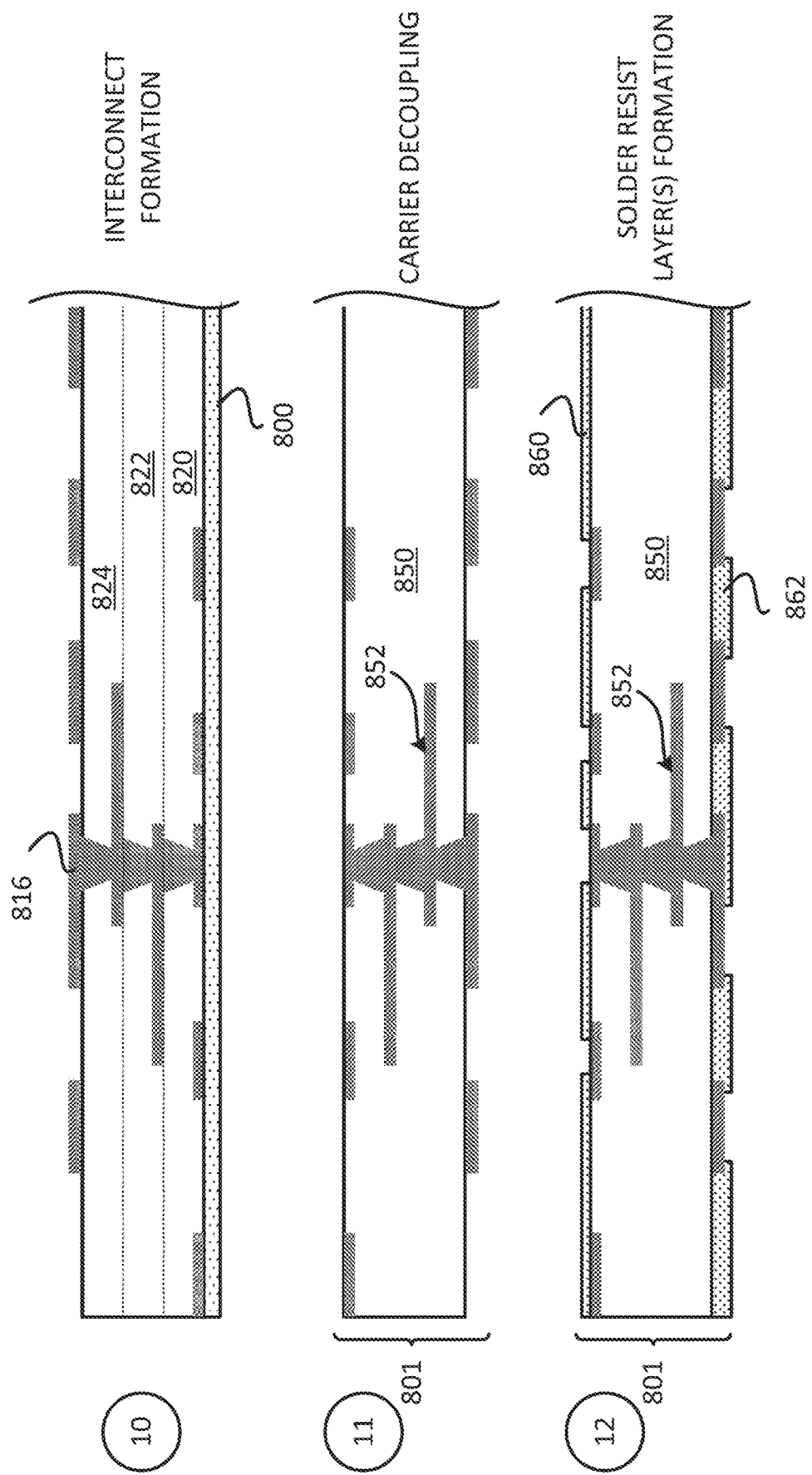

In some implementations, fabricating a substrate includes several processes. FIGS. 8A-8C illustrate an exemplary sequence for providing or fabricating a substrate. In some implementations, the sequence of FIGS. 8A-8C may be used to provide or fabricate the substrate 202 and/or the substrate 204 of FIG. 2. However, the process of FIGS. 8A-8C may be used to fabricate any of the substrates described in the disclosure.

It should be noted that the sequence of FIGS. 8A-8C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 8A, illustrates a state after a carrier 800 is provided and a metal layer is formed over the carrier 800. The metal layer may be patterned to form interconnects 802. A plating process and etching process may be used to form the metal layer and interconnects. In some implementations, the carrier 800 may be provided with a metal layer that is patterned to form the interconnects 802.

Stage 2 illustrates a state after a dielectric layer 820 is formed over the carrier 800 and the interconnects 802. The dielectric layer 820 may include polyimide. However, different implementations may use different materials for the dielectric layer.

Stage 3 illustrates a state after a plurality of cavities 810 is formed in the dielectric layer 820. The plurality of cavities 810 may be formed using an etching process (e.g., photo etching process) or laser process.

Stage 4 illustrates a state after interconnects 812 are formed in and over the dielectric layer 820, including in and over the plurality of cavities 810. For example, a via, pad and/or traces may be formed. A plating process may be used to form the interconnects.

Stage 5 illustrates a state after another dielectric layer 822 is formed over the dielectric layer 820. The dielectric layer 822 may be the same material as the dielectric layer 820. However, different implementations may use different materials for the dielectric layer.

Stage 6, as shown in FIG. 8B, illustrates a state after a plurality of cavities 830 is formed in the dielectric layer 822. An etching process or laser process may be used to form the cavities 830.

Stage 7 illustrates a state after interconnects 814 are formed in and over the dielectric layer 822, including in and over the plurality of cavities 830. For example, via, pad and/or trace may be formed. A plating process may be used to form the interconnects.

Stage 8 illustrates a state after another dielectric layer 824 is formed over the dielectric layer 822. The dielectric layer 824 may be the same material as the dielectric layer 820. However, different implementations may use different materials for the dielectric layer.

Stage 9 illustrates a state after a plurality of cavities 840 is formed in the dielectric layer 824. An etching process or laser process may be used to form the cavities 840.

Stage 10, as shown in FIG. 8C, illustrates a state after interconnects 816 are formed in and over the dielectric layer 824, including in and over the plurality of cavities 840. For example, via, pad and/or trace may be formed. A plating process may be used to form the interconnects.

Some or all of the interconnects 802, 812, 814 and/or 816 may define a plurality of interconnects 852 of the substrate 801. The dielectric layers 820, 822, 824 may be represented by the at least one dielectric layer 850.

Stage 11 illustrates a state after the carrier 800 is decoupled (e.g., removed, grinded out) from the dielectric layer 850, leaving the substrate 801 that includes the at least one dielectric layer 850 and the plurality of interconnects 852. The substrate 801 may represent the substrate 202 and/or the substrate 204.

Stage 12 illustrates a state after the first solder resist layer 860 and the second solder resist layer 862 are formed over the substrate 801. A deposition process may be used to form the first solder resist layer 860 and the second solder resist layer 862. In some implementations, none or one solder resist layer may be formed over the at least one dielectric layer 850.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 9:
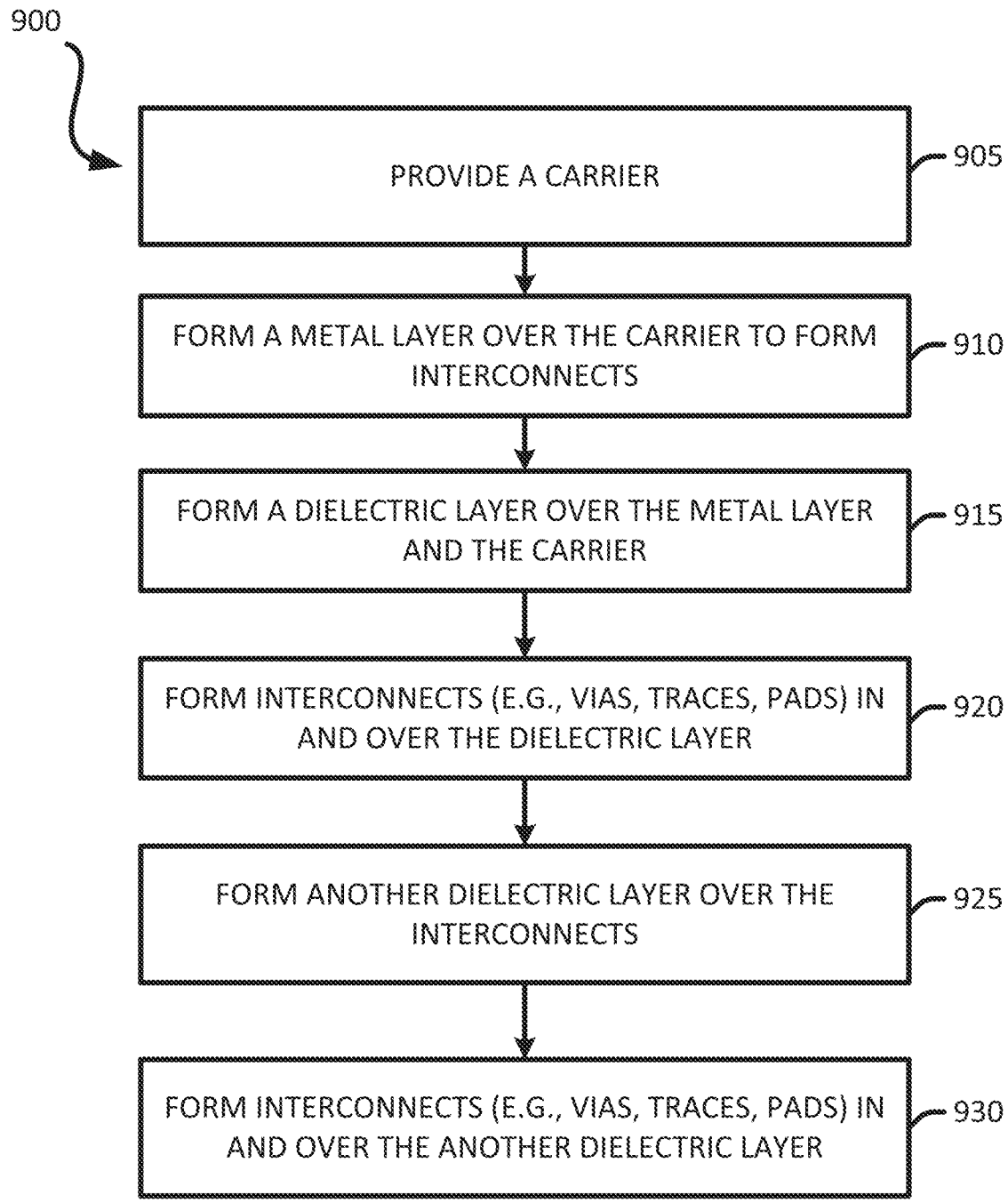
FIG. 9 illustrates an exemplary flow diagram of a method for fabricating a substrate.

In some implementations, fabricating a substrate includes several processes. FIG. 9 illustrates an exemplary flow diagram of a method 900 for providing or fabricating a substrate. In some implementations, the method 900 of FIG. 9 may be used to provide or fabricate the substrate(s) of FIG. 2. For example, the method of FIG. 9 may be used to fabricate the substrate 202 and/or the substrate 204.

It should be noted that the method of FIG. 9 may combine one or more processes in order to simplify and/or clarify the method for providing or fabricating a substrate. In some implementations, the order of the processes may be changed or modified.

The method provides (at 905) a carrier 800. Different implementations may use different materials for the carrier. The carrier may include a substrate, glass, quartz and/or carrier tape. Stage 1 of FIG. 8A illustrates and describes an example of a carrier that is provided.

The method forms (at 910) a metal layer over the carrier 800. The metal layer may be patterned to form interconnects. A plating process may be used to form the metal layer and interconnects. In some implementations, the carrier may include a metal layer. The metal layer over the carrier may be patterned to form interconnects (e.g., 802). Stage 1 of FIG. 8A illustrates and describes an example of a metal layer and interconnects that are formed over a carrier.

The method forms (at 915) a dielectric layer 820 over the carrier 800 and the interconnects 802. The dielectric layer 820 may include polyimide. Forming the dielectric layer may also include forming a plurality of cavities (e.g., 810) in the dielectric layer 820. The plurality of cavities may be formed using an etching process (e.g., photo etching) or laser process. Stages 2-3 of FIG. 8A illustrate and describe an example of forming a dielectric layer and cavities in the dielectric layer.

The method forms (at 920) interconnects in and over the dielectric layer. For example, the interconnects 812 may be formed in and over the dielectric layer 820. A plating process may be used to form the interconnects. Forming interconnects may include providing a patterned metal layer over and/or in the dielectric layer. Forming interconnects may also include forming interconnects in cavities of the dielectric layer. Stage 4 of FIG. 8A illustrates and describes an example of forming interconnects in and over a dielectric layer.

The method forms (at 925) a dielectric layer 822 over the dielectric layer 820 and the interconnects. The dielectric layer 822 may include polyimide. Forming the dielectric layer may also include forming a plurality of cavities (e.g., 830) in the dielectric layer 822. The plurality of cavities may be formed using an etching process or laser process. Stages 5-6 of FIGS. 8A-8B illustrate and describe an example of forming a dielectric layer and cavities in the dielectric layer.

The method forms (at 930) interconnects in and/or over the dielectric layer. For example, the interconnects 814 may be formed. A plating process may be used to form the interconnects. Forming interconnects may include providing a patterned metal layer over an in the dielectric layer. Forming interconnects may also include forming interconnects in cavities of the dielectric layer. Stage 7 of FIG. 8B illustrates and describes an example of forming interconnects in and over a dielectric layer.

The method may form additional dielectric layer(s) and additional interconnects as described at 925 and 930. Stages 8-10 of FIGS. 8B-8C illustrate and describe an example of forming an additional dielectric layer and interconnects in and over a dielectric layer.

Once all the dielectric layer(s) and additional interconnects are formed, the method may decouple (e.g., remove, grind out) the carrier (e.g., 800) from the dielectric layer 820, leaving the substrate. In some implementations, the method may form solder resist layers (e.g., 860, 862) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Packages that Include a Passive Component

As mentioned above, a package may include more than three substrates. FIG. 10 illustrates a profile view of a package 1000 that includes three substrates and a passive component located between two substrates. The package 1000 may be implemented as part of a device. The package 1000 may be similar to the package 200. The package 1000 includes an integrated device 201, a substrate 202, a substrate 204, a substrate 1002, an integrated device 203, an integrated device 205, an encapsulation layer 208, a passive component 211, a passive component 213, a passive component 215, a plurality of solder interconnects 226, an encapsulation layer 260, and an encapsulation layer 1060. The package 1000 is coupled to a board 209 (e.g., printed circuit board) through the plurality of solder interconnects 226. As will be further described below, at least one passive component (e.g., 213, 215) is located between the substrate 1002 and the substrate 204, which may help improve the power distribution network (PDN) performance of the package 1000, for similar reasons as described above for the package 200.

The substrate 1002 may be a third substrate. The substrate 1002 includes at least one dielectric layer 1020 and a plurality of interconnects 1022. The substrate 1002 may also include a plurality of pillar interconnects 1061 and a plurality of pillar interconnects 1063. The plurality of pillar interconnects 1061 and/or the plurality of pillar interconnects 1063 may include a means for pillar interconnection (e.g., means for first pillar interconnection). Different substrates may have different numbers of metal layers. Different implementations may use different substrates for the substrate 1002. The substrate 1002 may include an embedded trace substrate (ETS), a laminate substrate, and/or a coreless substrate. The substrate 1002 may be fabricated using different processes, including an ETS process, a semi-additive process (SAP), and a modified semi-additive process (mSAP).

The substrate 202 is coupled to the substrate 1002. For example, the substrate 202 is coupled to the substrate 1002 through the plurality of pillar interconnects 261, the plurality of solder interconnects 1064, and the plurality of pillar interconnects 1063. The plurality of pillar interconnects 1063 or the plurality of pillar interconnects 261 may be optional. Thus, for example, the substrate 202 may be coupled to the substrate 1002 through the plurality of pillar interconnects 261 and the plurality solder interconnects 1063. The plurality of solder interconnects 1063 may be coupled to interconnects (e.g., pads) from the plurality of interconnects 1022 from the substrate 1002. The encapsulation layer 1060 may be located between the substrate 202 and the substrate 1002. The encapsulation layer 1060 may be similar or different than the encapsulation layer 260. The encapsulation layer 1060 may be a means for encapsulation.

The substrate 1002 is coupled to the substrate 204. For example, the substrate 1002 is coupled to the substrate 204 through the plurality of pillar interconnects 1061, the plurality of solder interconnects 264, and the plurality of pillar interconnects 263. The encapsulation layer 260 may be located between the substrate 1002 and the substrate 204. It is noted that any of the substrate 202, the substrate 204 and the substrate 1002 may be a first substrate, a second substrate or a third substrate.

The passive components 213 and 215 may be coupled to the substrate 1002 and the substrate 204 in a similar manner as described in FIGS. 2-5. The passive components 213 and 215 may be part of a PDN for the package 1000. In some implementations, one or more passive components may be located between the substrate 202 and the substrate 1002. The one or more passive components may be part of a PDN for the package 1000. It is noted that the passive components 213 and/or 215 may be located in different locations of the package 1000. For example, the passive components 213 and/or 215 may be coupled to a top surface of the substrate 202. It is also noted that in some implementations, there may not be a passive component between (1) the substrate 1002 and the substrate 204, and (2) the substrate 202 and the substrate 1002.

Figure 11:
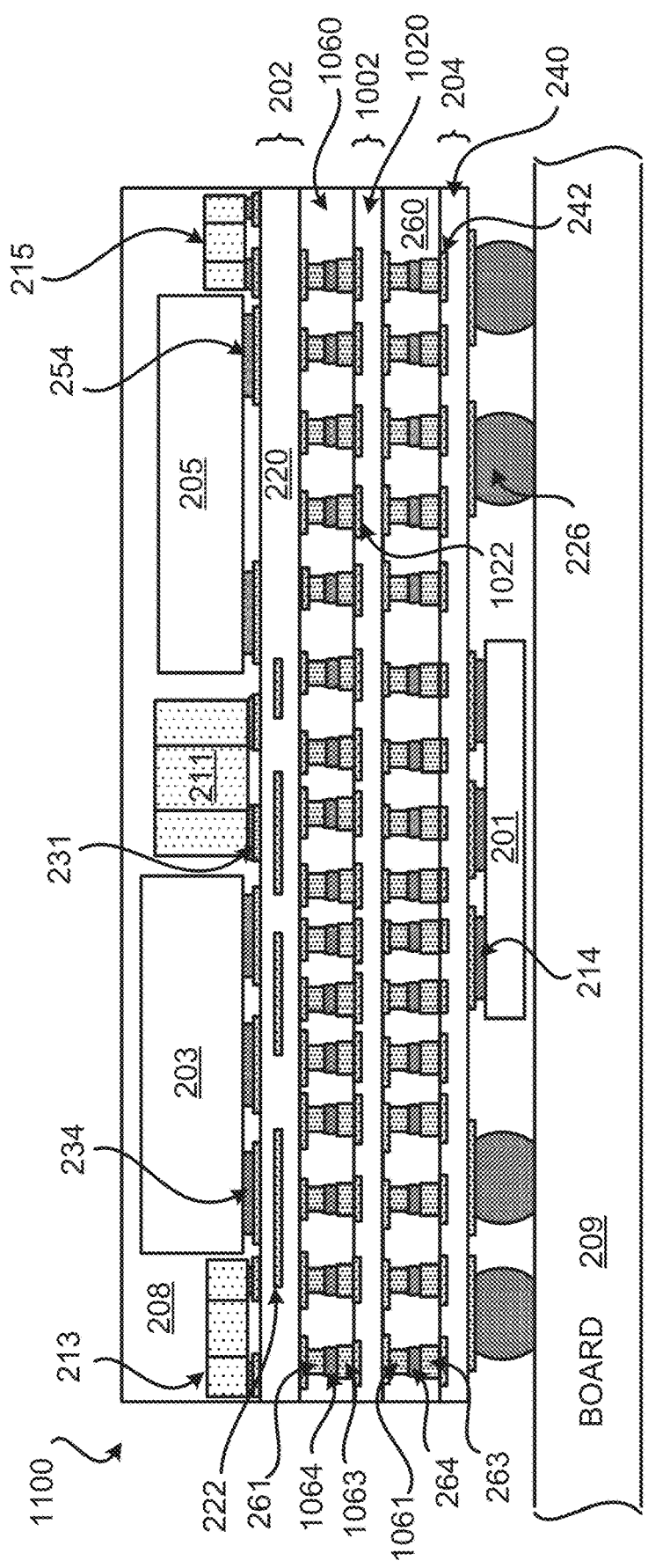
FIG. 11 illustrates a profile view of a package that includes three substrates.

FIG. 11 illustrates a profile view of a package 1100 that includes three substrates. The package 1100 is similar to the package 1000 of FIG. 10, and thus includes the same and/or similar components as the package 1000. The package 1100 illustrates a configuration where there are no passive components between (1) the substrate 1002 and the substrate 204, and (2) the substrate 202 and the substrate 1002. The passive components 213 and 215 are coupled to a top surface of the substrate 202. The passive components 213 and 215 may be located closer to the integrated device 203 and/or the integrated device 205. This may be beneficial for the overall performance of the package 1100 if the integrated device 203, the integrated device 205, the passive components 213 and/or 215 are part of a PDN for the package 1100.

Figure 12:
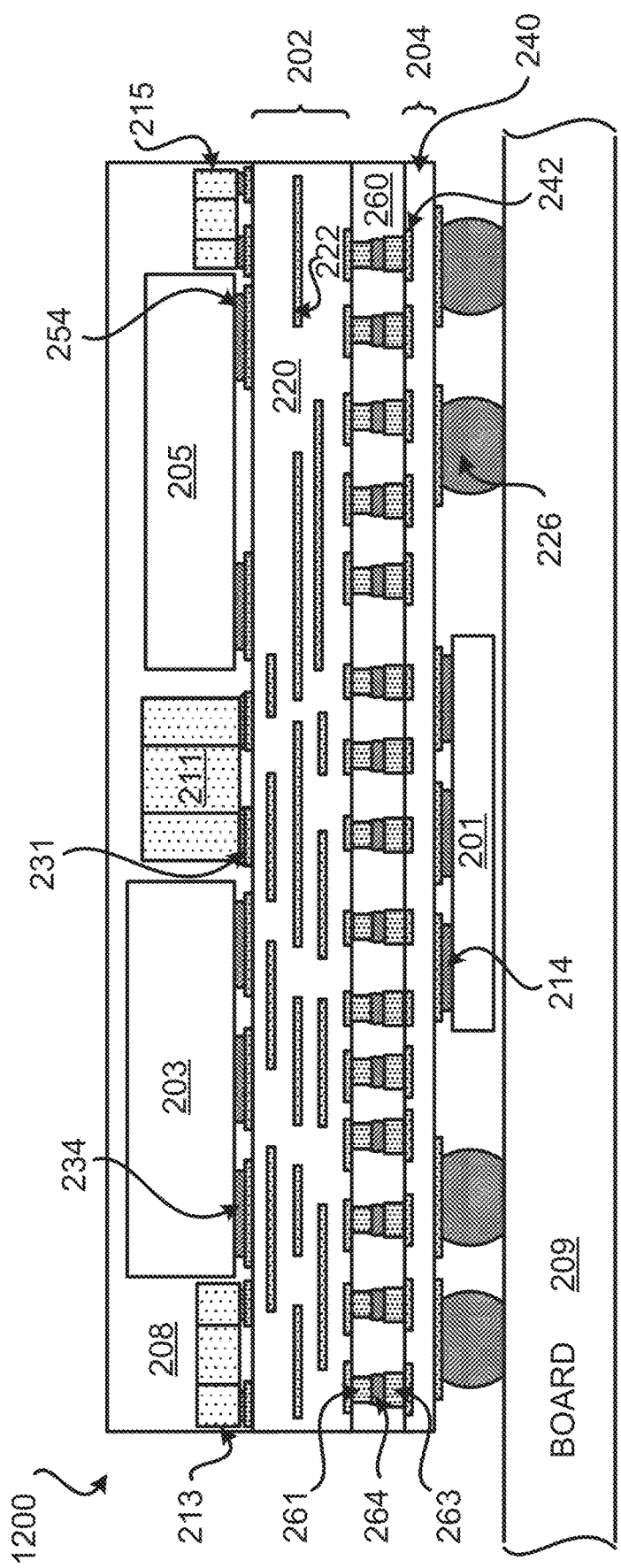
FIG. 12 illustrates a profile view of a package that includes two substrates.

FIG. 12 illustrates a profile view of a package 1200 that includes two substrates. The package 1200 is similar to the package 200 of FIG. 2, and thus includes the same and/or similar components as the package 200. The package 1200 illustrates a configuration where there are no passive components between the substrate 202 and the substrate 204. The passive components 213 and 215 are coupled to a top surface of the substrate 202. The passive components 213 and 215 may be located closer to the integrated device 203 and/or the integrated device 205. This may be beneficial for the overall performance of the package 1200 if the integrated device 203, the integrated device 205, the passive components 213 and/or 215 are part of a PDN for the package 1200.

It is noted that for each of the packages 200, 1000, 1100 and/or 1200, the combined total number of metal layers for all substrates may be approximately the same. For example, each of the packages 200, 1000, 1100 and/or 1200 may have a combined total of about 10 or 11 metal layers. However, different packages may have different numbers of metal layers.

Exemplary Electronic Devices

Figure 13:
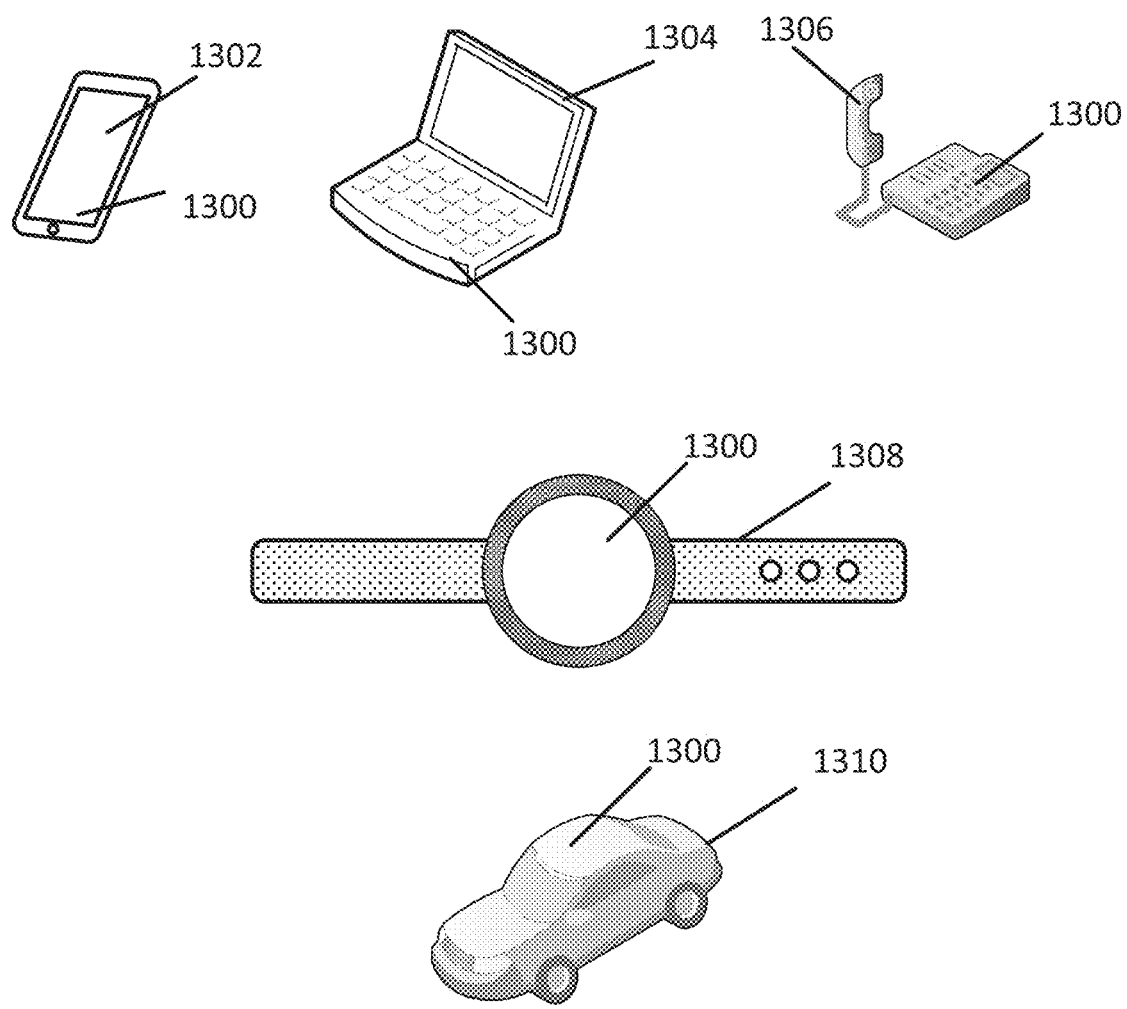
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-5, 6A-6D, 7, 8A-8C and/or 9-13 may be rearranged and/or combined into a single component, process, feature or function or embodied in several components, processes, or functions. Additional elements, components, processes, and/or functions may also be added without departing from the disclosure. It should also be noted FIGS. 2-5, 6A-6D, 7, 8A-8C and/or 9-13 and its corresponding description in the present disclosure is not limited to dies and/or ICs. In some implementations, FIGS. 2-5, 6A-6D, 7, 8A-8C and/or 9-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The following provides an overview of aspects of the present disclosure:

Aspect 1: A device comprising a first substrate comprising a first plurality of pillar interconnects, a second substrate comprising a second plurality of pillar interconnects, a passive component located between the first substrate and the second substrate, and an integrated device coupled to the first substrate. The second plurality of pillar interconnects is coupled to the first plurality of pillar interconnects through a plurality of solder interconnects.

Aspect 2: The device of aspect 1, wherein the integrated device is configured to be electrically coupled to the passive component, as part of a power distribution network (PDN).

Aspect 3: The device of aspects 1 through 2, further comprising an encapsulation layer located between the first substrate and the second substrate, wherein the encapsulation layer at least partially encapsulates the passive component, the first plurality of pillar interconnects, the second plurality of pillar interconnects and the plurality of solder interconnects.

Aspect 4: The device of aspect 3, wherein the encapsulation layer includes a mold, an underfill, an adhesive, a non-conductive paste (NCP) and/or a non-conductive film (NCF).

Aspect 5: The device of aspects 1 through 4, wherein the first substrate and the second substrate are separated by a minimum spacing of about 120 micrometers.

Aspect 6: The device of aspects 1 through 5, further comprising a second integrated device coupled to the second substrate.

Aspect 7: The device of aspect 6, wherein the second integrated device is configured to be electrically coupled to the passive component.

Aspect 8: The device of aspects 1 through 7, wherein the first substrate includes 7 or less metal layers, and wherein the second substrate includes 4 or less metal layers.

Aspect 9: The device of aspects 1 through 8, wherein the first plurality of pillar interconnects includes a height of about 60 micrometers or less, and wherein the second plurality of pillar interconnects includes a height of about 60 micrometers or less.

Aspect 10: The device of aspect 9, wherein the passive component includes a height of about 100 micrometers or less.

Aspect 11: An apparatus comprising a first substrate comprising means for first pillar interconnection, a second substrate comprising means for second pillar interconnection, a passive component located between the first substrate and the second substrate, and an integrated device coupled to the first substrate. The means for second pillar interconnection is coupled to the means for first pillar interconnection through a plurality of solder interconnects.

Aspect 12: The apparatus of aspect 11, wherein the integrated device is configured to be electrically coupled to the passive component, as part of a power distribution network (PDN).

Aspect 13: The apparatus of aspects 11 through 12, further comprising a means for encapsulation located between the first substrate and the second substrate, wherein the means for encapsulation at least partially encapsulates the passive component, the means for first pillar interconnection, the means for second pillar interconnection and the plurality of solder interconnects.

Aspect 14: The apparatus of aspect 13, wherein the means for encapsulation includes a mold, an underfill, an adhesive, a non-conductive paste (NCP) and/or a non-conductive film (NCF).

Aspect 15: The apparatus of aspects 11 through 14, wherein the first substrate and the second substrate are separated by a minimum spacing of about 120 micrometers.

Aspect 16: The apparatus of aspects 11 through 15, further comprising a second integrated device coupled to the second substrate.

Aspect 17: The apparatus of aspect 16, wherein the second integrated device is configured to be electrically coupled to the passive component.

Aspect 18: The apparatus of aspects 11 through 17, wherein the first substrate includes 7 or less metal layers, and wherein the second substrate includes 4 or less metal layers.

Aspect 19: The apparatus of aspects 11 through 18, wherein the means for first pillar interconnection includes a height of about 60 micrometers or less, and wherein the means for second pillar interconnection includes a height of about 60 micrometers or less.

Aspect 20: The apparatus of aspect 19, wherein the passive component includes a height of about 100 micrometers or less.

Aspect 21: The apparatus of aspects 11 through 20, wherein the apparatus is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 22: A method for fabricating a device. The method provides a first substrate comprising a first plurality of pillar interconnects. The method couples a passive component to the first substrate. The method couples a second substrate comprising a second plurality of pillar interconnects, to the first substrate. Coupling the second substrate to the first substrate comprises coupling the second plurality of pillar interconnects to the first plurality of pillar interconnects through a plurality of solder interconnects. The second substrate is coupled to the first substrate such that the passive component is located between the first substrate and the second substrate. The method couples an integrated device to the first substrate.

Aspect 23: The method of aspect 22, wherein the integrated device is configured to be electrically coupled to the passive component, as part of a power distribution network (PDN).

Aspect 24: The method of aspects 22 through 23, further comprising forming an encapsulation layer between the first substrate and the second substrate, wherein the encapsulation layer at least partially encapsulates the passive component, the first plurality of pillar interconnects, the second plurality of pillar interconnects and the plurality of solder interconnects.

Aspect 25: The method of aspect 24, wherein the encapsulation layer includes a mold, an underfill, an adhesive, a non-conductive paste (NCP) and/or a non-conductive film (NCF).

Aspect 26: The method of aspects 22 through 25, wherein the first substrate and the second substrate are separated by a minimum spacing of about 120 micrometers.

Aspect 27: The method of aspects 22 through 26, further comprising coupling a second integrated device coupled to the second substrate.

Aspect 28: The method of aspect 27, wherein the second integrated device is configured to be electrically coupled to the passive component.

Aspect 29: The method of aspects 22 through 28, wherein the first substrate includes 7 or less metal layers, and wherein the second substrate includes 4 or less metal layers.

Aspect 30: The method of aspect 29, wherein the first plurality of pillar interconnects includes a height of about 60 micrometers or less, wherein the second plurality of pillar interconnects includes a height of about 60 micrometers or less, and wherein the passive component includes a height of about 100 micrometers or less.

Aspect 31: The method of aspects 22 through 30, further comprising coupling a third substrate to the second substrate, where the third substrate comprises a third plurality of pillar interconnects.

Aspect 32: The device of aspects 1 through 10, further comprising a third substrate coupled to the second substrate, where the third substrate comprises a third plurality of pillar interconnects.

Aspect 33: The apparatus of aspects 11 through 21, further comprising a third substrate coupled to the second substrate, where the third substrate comprises a third plurality of pillar interconnects.

Aspect 34: A device comprising a first substrate comprising a first plurality of pillar interconnects, a second substrate comprising a second plurality of pillar interconnects, a passive component coupled to the second substrate, and an integrated device coupled to the first substrate. The second plurality of pillar interconnects is coupled to the first plurality of pillar interconnects through a plurality of solder interconnects.

Aspect 35: The device of aspect 34, wherein the integrated device is configured to be electrically coupled to the passive component, as part of a power distribution network (PDN).

Aspect 36: The device of aspects 34 through 35, further comprising an encapsulation layer located between the first substrate and the second substrate, wherein the encapsulation layer at least partially encapsulates the first plurality of pillar interconnects, the second plurality of pillar interconnects and the plurality of solder interconnects.

Aspect 37: The device of aspect 36, wherein the encapsulation layer includes a mold, an underfill, an adhesive, a non-conductive paste (NCP) and/or a non-conductive film (NCF).

Aspect 38: The device of aspects 34 through 37, wherein the first substrate and the second substrate are separated by a minimum spacing of about 120 micrometers.

Aspect 39: The device of aspects 34 through 38, further comprising a second integrated device coupled to the second substrate.

Aspect 40: The device of aspect 39, wherein the second integrated device is configured to be electrically coupled to the passive component.

Aspect 41: The device of aspects 34 through 40, wherein the first substrate includes 7 or less metal layers, and wherein the second substrate includes 4 or less metal layers.

Aspect 42: The device of aspects 34 through 41, further comprising a third substrate coupled to the second substrate, where the third substrate comprises a third plurality of pillar interconnects.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a first substrate comprising:
a first dielectric layer;
a first plurality of interconnects located at least partially in the first dielectric layer; and
a first plurality of pillar interconnects coupled to the first plurality of interconnects;
a second substrate comprising:
a second dielectric layer;
a second plurality of interconnects located at least partially in the second dielectric layer; and
a second plurality of pillar interconnects coupled to the second plurality of interconnects, wherein the second plurality of pillar interconnects are coupled to the first plurality of pillar interconnects through a plurality of solder interconnects;
a passive component located between the first substrate and the second substrate, wherein the passive component is directly touching a surface of the first substrate or a surface of the second substrate;
a first integrated device coupled to a first surface of the first substrate, wherein the first surface is a surface that faces away from the second substrate; and
a second integrated device coupled to a second surface of the second substrate, wherein the second surface faces away from the first substrate.

2. The device of claim 1, wherein the first integrated device is configured to be electrically coupled to the passive component, as part of a power distribution network (PDN).

3. The device of claim 1, further comprising an encapsulation layer located between the first substrate and the second substrate, wherein the encapsulation layer at least partially encapsulates the passive component, the first plurality of pillar interconnects, the second plurality of pillar interconnects and the plurality of solder interconnects.

4. The device of claim 3, wherein the encapsulation layer includes a mold, an underfill, an adhesive, a non-conductive paste (NCP) and/or a non-conductive film (NCF).

5. The device of claim 1, wherein the first substrate and the second substrate are separated by a minimum spacing of about 120 micrometers.

6. The device of claim 1, further comprising a third plurality of solder interconnects coupled to the second surface of the second substrate,
wherein the third plurality of solder interconnects are located laterally to the second integrated device, and
wherein the second integrated device is coupled to the second substrate such that the second integrated device is not located between the first substrate and the second substrate.

7. The device of claim 6, wherein the second integrated device is configured to be electrically coupled to the passive component.

8. The device of claim 1,
wherein the first substrate includes 7 or less metal layers, and
wherein the second substrate includes 4 or less metal layers.

9. The device of claim 1,
wherein the first plurality of pillar interconnects includes a height of about 60 micrometers or less, and
wherein the second plurality of pillar interconnects includes a height of about 60 micrometers or less.

10. The device of claim 9, wherein the passive component includes a height of about 100 micrometers or less.

11. An apparatus comprising:
a first substrate comprising:
a first dielectric layer;
a first plurality of interconnects; and
means for first pillar interconnection;
a second substrate comprising:
a second dielectric layer;
a second plurality of interconnects; an
means for second pillar interconnection, wherein the means for second pillar interconnection is coupled to the means for first pillar interconnection through a plurality of solder interconnects;
a passive component located between the first substrate and the second substrate,
wherein the passive component is coupled to the first substrate through a first plurality of solder interconnects, and
wherein the passive component is coupled to the second substrate through a second plurality of solder interconnects;
a first integrated device coupled to a first surface of the first substrate, wherein the first surface is a surface that faces away from the second substrate; and
a second integrated device coupled to a second surface of the second substrate, wherein the second surface faces away from the first substrate.

12. The apparatus of claim 11, wherein the first integrated device is configured to be electrically coupled to the passive component, as part of a power distribution network (PDN).

13. The apparatus of claim 11, further comprising a means for encapsulation located between the first substrate and the second substrate, wherein the means for encapsulation at least partially encapsulates the passive component, the means for first pillar interconnection, the means for second pillar interconnection and the plurality of solder interconnects.

14. The apparatus of claim 13, wherein the means for encapsulation includes a mold, an underfill, an adhesive, a non-conductive paste (NCP) and/or a non-conductive film (NCF).

15. The apparatus of claim 11, wherein the first substrate and the second substrate are separated by a minimum spacing of about 120 micrometers.

16. The apparatus of claim 11, further comprising a third plurality of solder interconnects coupled to the second surface of the second substrate,
wherein the third plurality of solder interconnects are located laterally to the second integrated device, and
wherein the second integrated device is coupled to the second substrate such that the second integrated device is not located between the first substrate and the second substrate.

17. The apparatus of claim 16, wherein the second integrated device is configured to be electrically coupled to the passive component.

18. The apparatus of claim 11,
wherein the first substrate includes 7 or less metal layers, and
wherein the second substrate includes 4 or less metal layers.

19. The apparatus of claim 11,
wherein the means for first pillar interconnection includes a height of about 60 micrometers or less, and
wherein the means for second pillar interconnection includes a height of about 60 micrometers or less.

20. The apparatus of claim 19, wherein the passive component includes a height of about 100 micrometers or less.

21. The apparatus of claim 11, wherein the apparatus is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

22. A method for fabricating a device, comprising:
providing a first substrate comprising a first plurality of pillar interconnects;
coupling a passive component to the first substrate;
coupling a second substrate comprising a second plurality of pillar interconnects, to the first substrate,
wherein the second substrate is coupled to the first substrate such that the passive component is directly touching a surface of the first substrate or a surface of the second substrate,
wherein coupling the second substrate to the first substrate comprises coupling the second plurality of pillar interconnects to the first plurality of pillar interconnects through a plurality of solder interconnects, and
wherein the second substrate is coupled to the first substrate such that the passive component is located between the first substrate and the second substrate;
coupling a second integrated device to a second surface of the second substrate, wherein the second surface faces away from the first substrate; and
coupling a first integrated device to a first surface of the first substrate, wherein the first surface is a surface that faces away from the second substrate.

23. The method of claim 22, wherein the first integrated device is configured to be electrically coupled to the passive component, as part of a power distribution network (PDN).

24. The method of claim 22, further comprising forming an encapsulation layer between the first substrate and the second substrate, wherein the encapsulation layer at least partially encapsulates the passive component, the first plurality of pillar interconnects, the second plurality of pillar interconnects and the plurality of solder interconnects.

25. The method of claim 24, wherein the encapsulation layer includes a mold, an underfill, an adhesive, a non-conductive paste (NCP) and/or a non-conductive film (NCF).

26. The method of claim 22, wherein the first substrate and the second substrate are separated by a minimum spacing of about 120 micrometers.

27. The method of claim 22, further comprising a third plurality of solder interconnects coupled to the second surface of the second substrate,
wherein the third plurality of solder interconnects are located laterally to the second integrated device, and
wherein the second integrated device is coupled to the second substrate such that the second integrated device is not located between the first substrate and the second substrate.

28. The method of claim 27, wherein the second integrated device is configured to be electrically coupled to the passive component.

29. The method of claim 22,
wherein the first substrate includes 7 or less metal layers, and
wherein the second substrate includes 4 or less metal layers.

30. The method of claim 29,
wherein the first plurality of pillar interconnects includes a height of about 60 micrometers or less,
wherein the second plurality of pillar interconnects includes a height of about 60 micrometers or less, and
wherein the passive component includes a height of about 100 micrometers or less.

* * * * *